US010908986B2

(12) United States Patent
Ellis et al.

(10) Patent No.: US 10,908,986 B2
(45) Date of Patent: Feb. 2, 2021

(54) MULTI-LEVEL RECOVERY READS FOR MEMORY

(71) Applicant: SanDisk Technologies LLC, Plano, TX (US)

(72) Inventors: Robert Ellis, Phoenix, AZ (US); Daniel Helmick, Broomfield, CO (US)

(73) Assignee: SanDisk Technologies LLC, Addison, TX (US)

( * ) Notice: Subject to any disclaimer, the term of this patent is extended or adjusted under 35 U.S.C. 154(b) by 264 days.

(21) Appl. No.: 15/943,456

(22) Filed: Apr. 2, 2018

(65) Prior Publication Data
US 2019/0303236 A1    Oct. 3, 2019

(51) Int. Cl.
*G06F 11/08* (2006.01)
*G06F 3/06* (2006.01)
*G11C 16/26* (2006.01)

(52) U.S. Cl.
CPC ............ *G06F 11/08* (2013.01); *G06F 3/065* (2013.01); *G06F 3/0619* (2013.01); *G06F 3/0655* (2013.01); *G06F 3/0679* (2013.01); *G11C 16/26* (2013.01)

(58) Field of Classification Search
CPC ........ G06F 11/08; G06F 3/0619; G06F 3/065; G06F 3/0655; G06F 3/0679; G11C 16/26
See application file for complete search history.

(56) References Cited

U.S. PATENT DOCUMENTS

| 6,137,719 | A | * | 10/2000 | Tsuruda | ............... G11C 11/5621 |
| | | | | | 365/185.03 |
| 7,369,441 | B2 | | 5/2008 | Huang | |
| 7,814,401 | B2 | | 10/2010 | Alrod et al. | |
| 7,904,793 | B2 | | 3/2011 | Mokhlesi et al. | |
| 8,059,457 | B2 | | 11/2011 | Perlmutter et al. | |
| 8,068,360 | B2 | * | 11/2011 | Anholt | ............... G11C 11/5642 |
| | | | | | 365/185.02 |
| 8,156,398 | B2 | | 4/2012 | Sommer | |
| 8,164,961 | B2 | * | 4/2012 | Honma | ............... G06F 11/1068 |
| | | | | | 365/185.21 |
| 8,233,324 | B2 | | 7/2012 | Sharon et al. | |
| 8,582,381 | B2 | | 11/2013 | Oowada et al. | |
| 8,773,904 | B2 | | 7/2014 | Anholt et al. | |
| 8,838,881 | B2 | * | 9/2014 | Patapoutian | ........ G06F 12/0246 |
| | | | | | 711/103 |

(Continued)

OTHER PUBLICATIONS

U.S. Appl. No. 15/333,440, filed Oct. 25, 2016 by Alrod et al.

*Primary Examiner* — Kamini B Patel
(74) *Attorney, Agent, or Firm* — Vierra Magen Marcus LLP

(57) ABSTRACT

Read operations are performed in a memory device which efficiently provide baseline read data and recovery read data. In one aspect, on-die circuitry, which is on a die with an array of memory cells, obtains recovery read data before it is requested or needed by an off-die controller. In another aspect, data from multiple reads is obtained and made available in a set of output latches for retrieval by the off-die controller. Read data relative to multiple read thresholds is obtained and transferred from latches associated with the sense circuits to the set of output latches. The read data relative to multiple read thresholds can be stored and held concurrently in the set of output latches for retrieval by the off-die controller.

17 Claims, 19 Drawing Sheets

(56) References Cited

U.S. PATENT DOCUMENTS

| | | |
|---|---|---|
| 9,036,415 B2 | 5/2015 | Sharon |
| 9,069,659 B1 | 6/2015 | Sabbag et al. |
| 9,431,118 B1 | 8/2016 | Bar et al. |
| 9,443,606 B2 * | 9/2016 | Dutta .................. G11C 11/5642 |
| 9,472,298 B1 | 10/2016 | Louie et al. |
| 9,543,030 B1 | 1/2017 | Amarnath et al. |
| 9,576,671 B2 | 2/2017 | Karakulak et al. |
| 9,576,673 B2 | 2/2017 | Jiang et al. |
| RE46,346 E | 3/2017 | Sommer et al. |
| 9,703,719 B2 | 7/2017 | Balakrishnan et al. |
| 9,721,671 B2 * | 8/2017 | Chu ................... G11C 16/3459 |
| 9,792,995 B1 | 10/2017 | Shah et al. |
| 10,552,045 B2 * | 2/2020 | Ouyang ................ G06F 3/0659 |
| 10,552,259 B2 * | 2/2020 | Jacobvitz ............... G11C 16/26 |
| 2010/0318839 A1 | 12/2010 | Avila et al. |
| 2012/0063227 A1 * | 3/2012 | Weingarten ......... G11C 11/5628 |
| | | 365/185.09 |
| 2012/0268994 A1 | 10/2012 | Nagashima |
| 2013/0094294 A1 * | 4/2013 | Kwak .................... G11C 16/08 |
| | | 365/185.03 |
| 2014/0043886 A1 * | 2/2014 | Wu ....................... G11C 11/419 |
| | | 365/148 |
| 2015/0078100 A1 * | 3/2015 | Nakayama ............. G11C 16/26 |
| | | 365/185.29 |
| 2015/0085571 A1 * | 3/2015 | Hu .................... G11C 16/3418 |
| | | 365/185.03 |
| 2016/0042802 A1 * | 2/2016 | Mui ....................... G11C 16/26 |
| | | 365/185.22 |
| 2016/0266967 A1 * | 9/2016 | Han ....................... G06F 12/02 |
| 2016/0358664 A1 | 12/2016 | Li et al. |
| 2019/0080747 A1 * | 3/2019 | Sakurada ............ G11C 11/5642 |
| 2019/0189228 A1 * | 6/2019 | Lin .................... G06F 11/1068 |

* cited by examiner

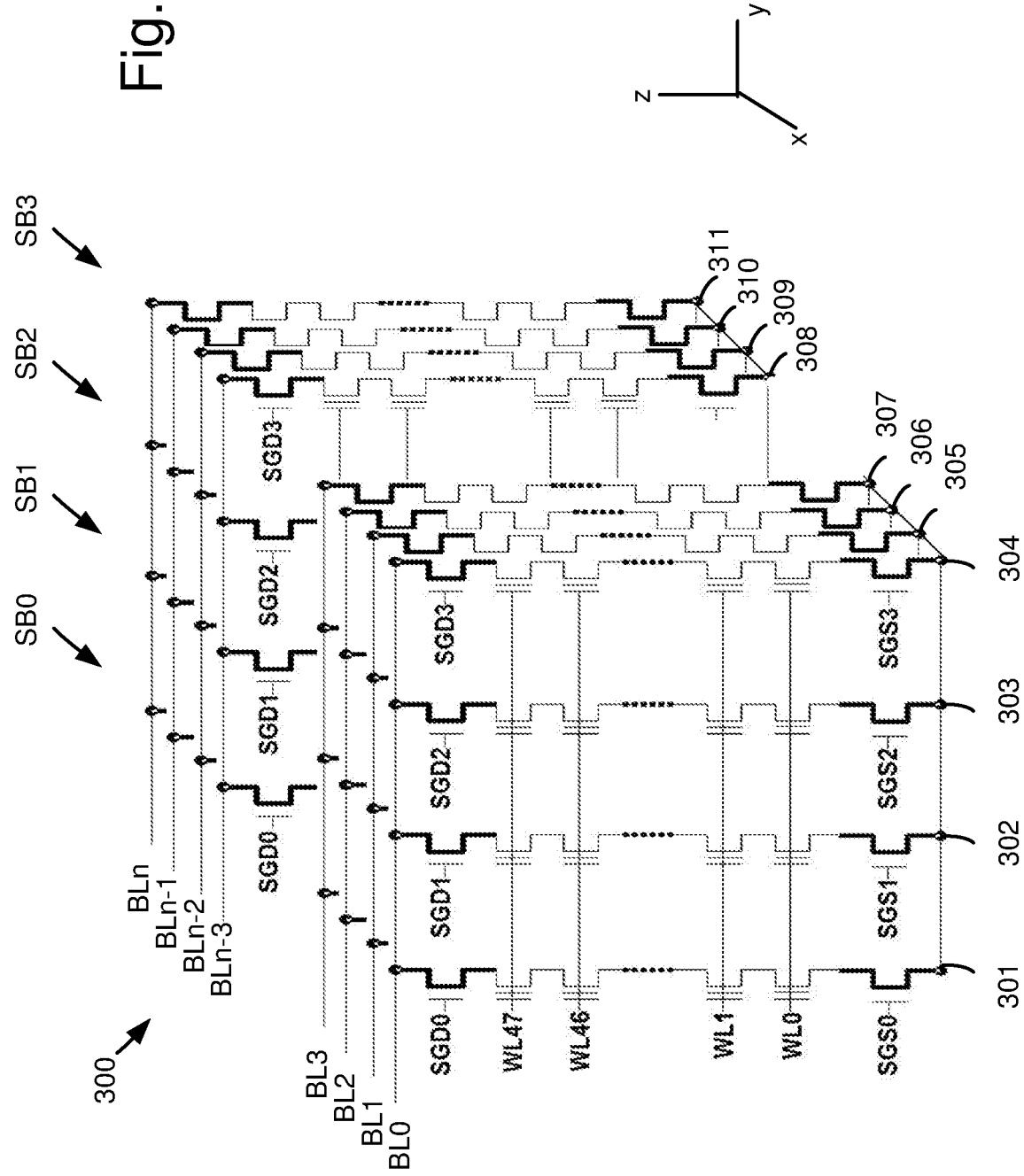

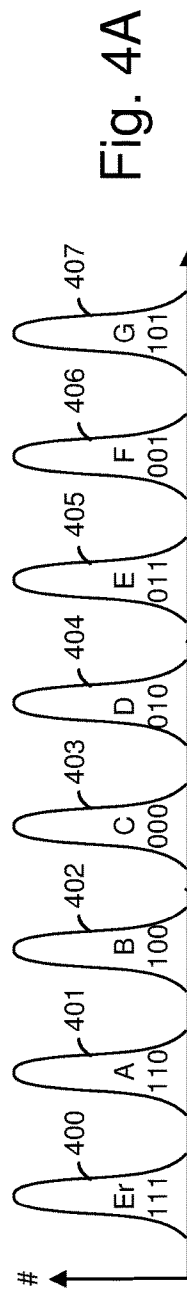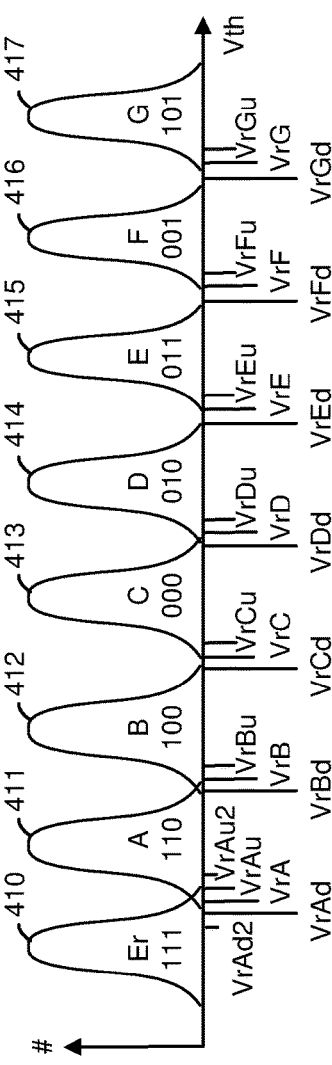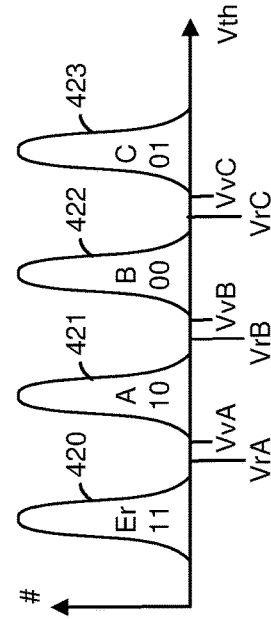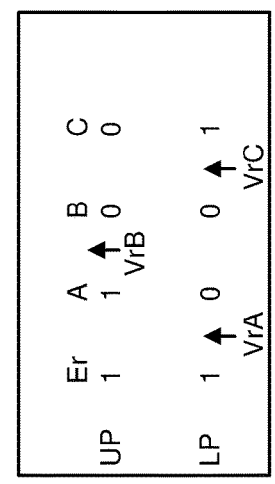
Fig. 4A
Fig. 4B
Fig. 4C
Fig. 4D
Fig. 4E

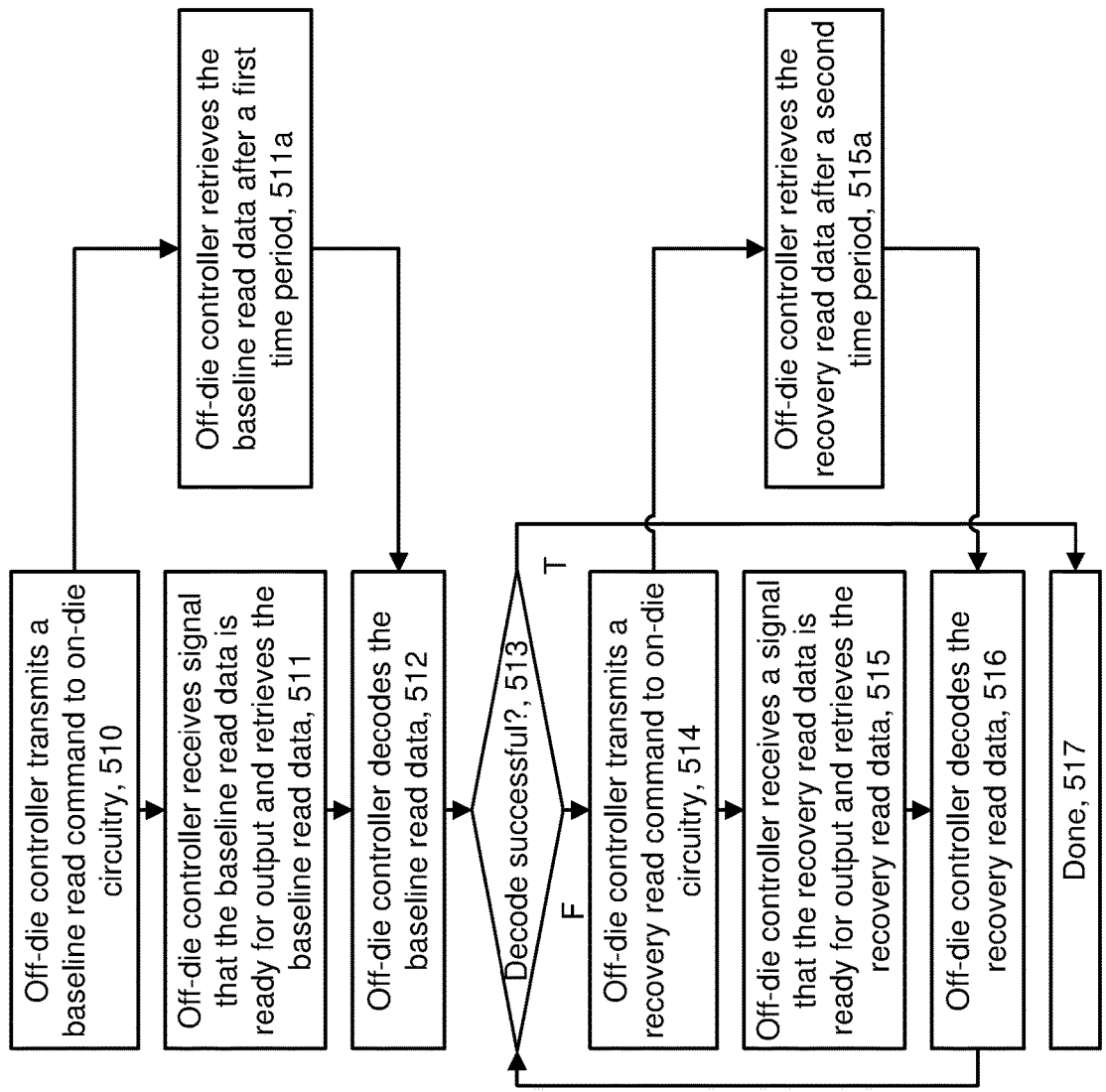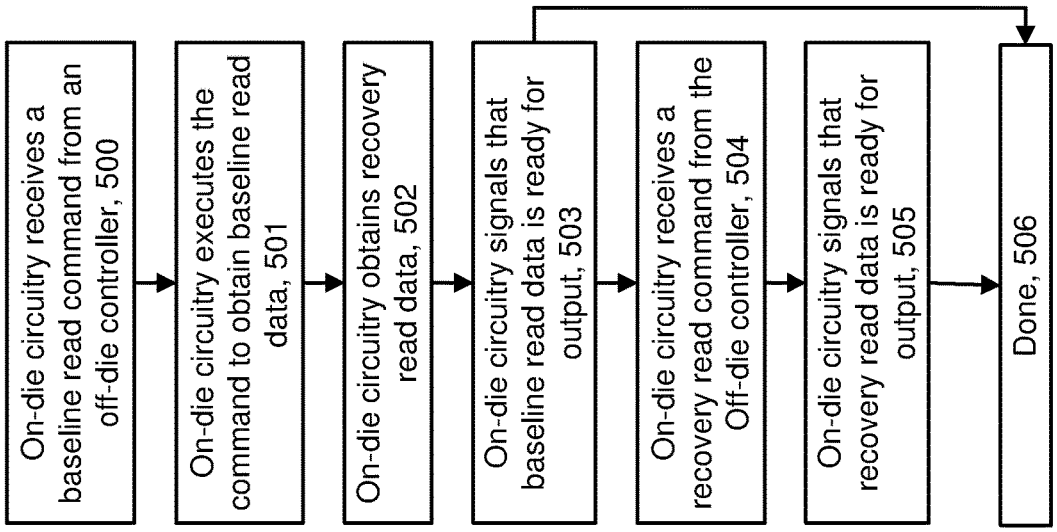

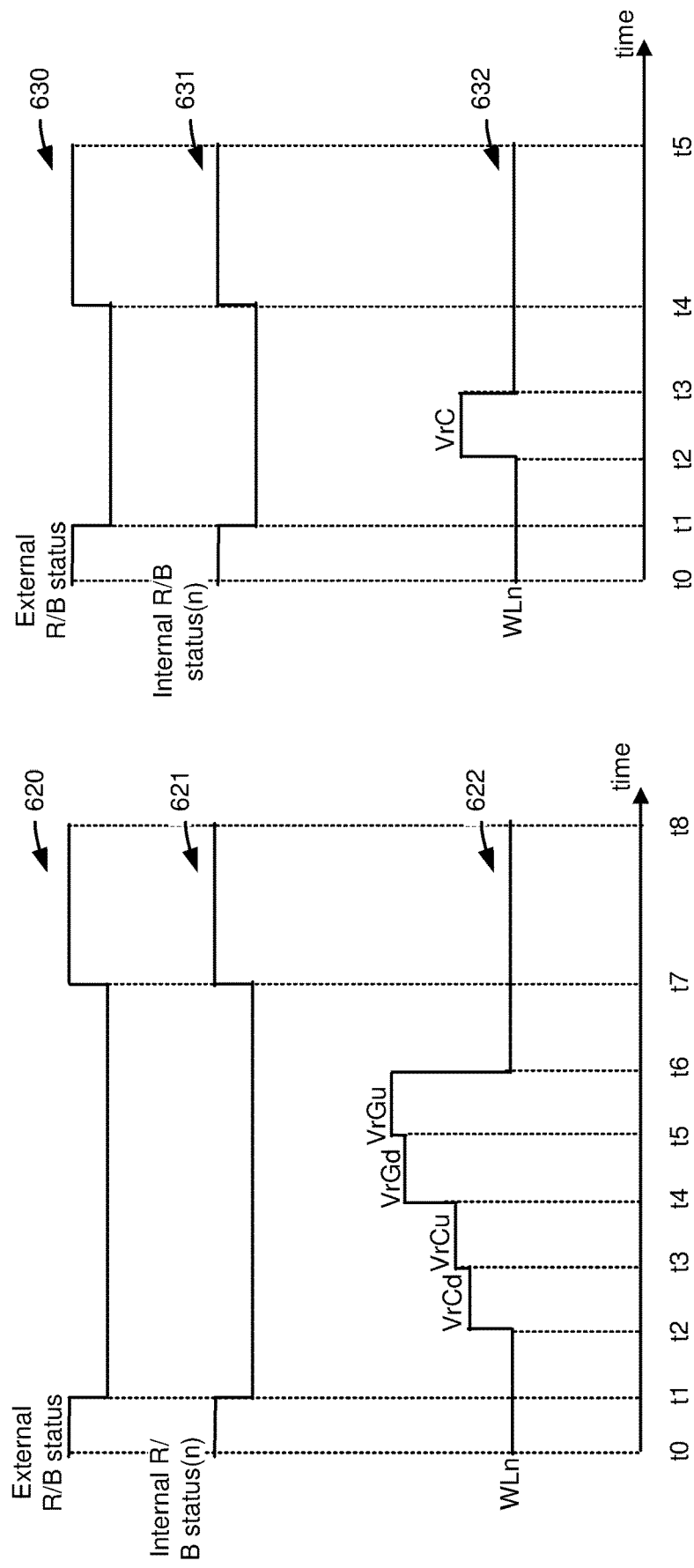

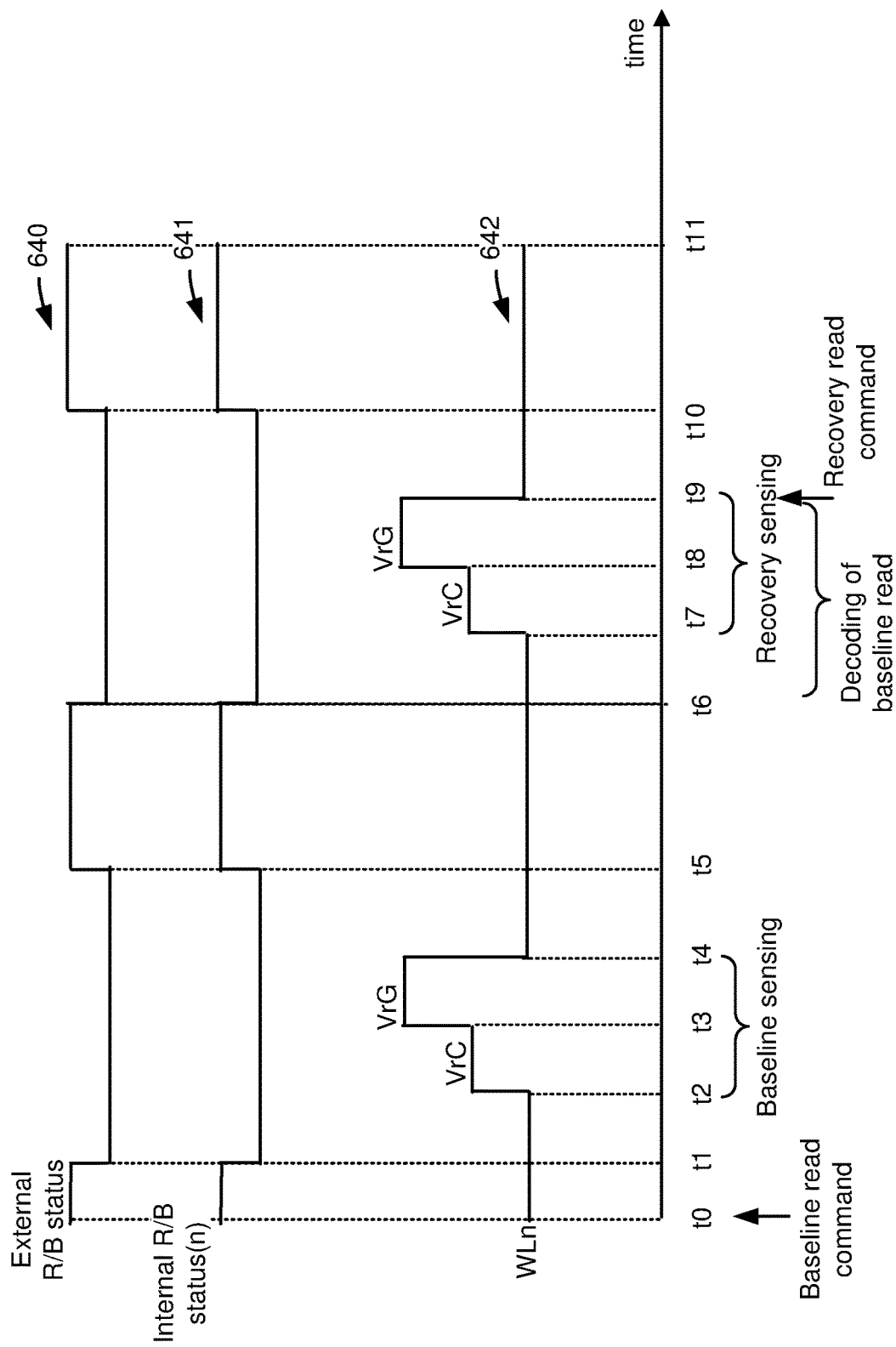

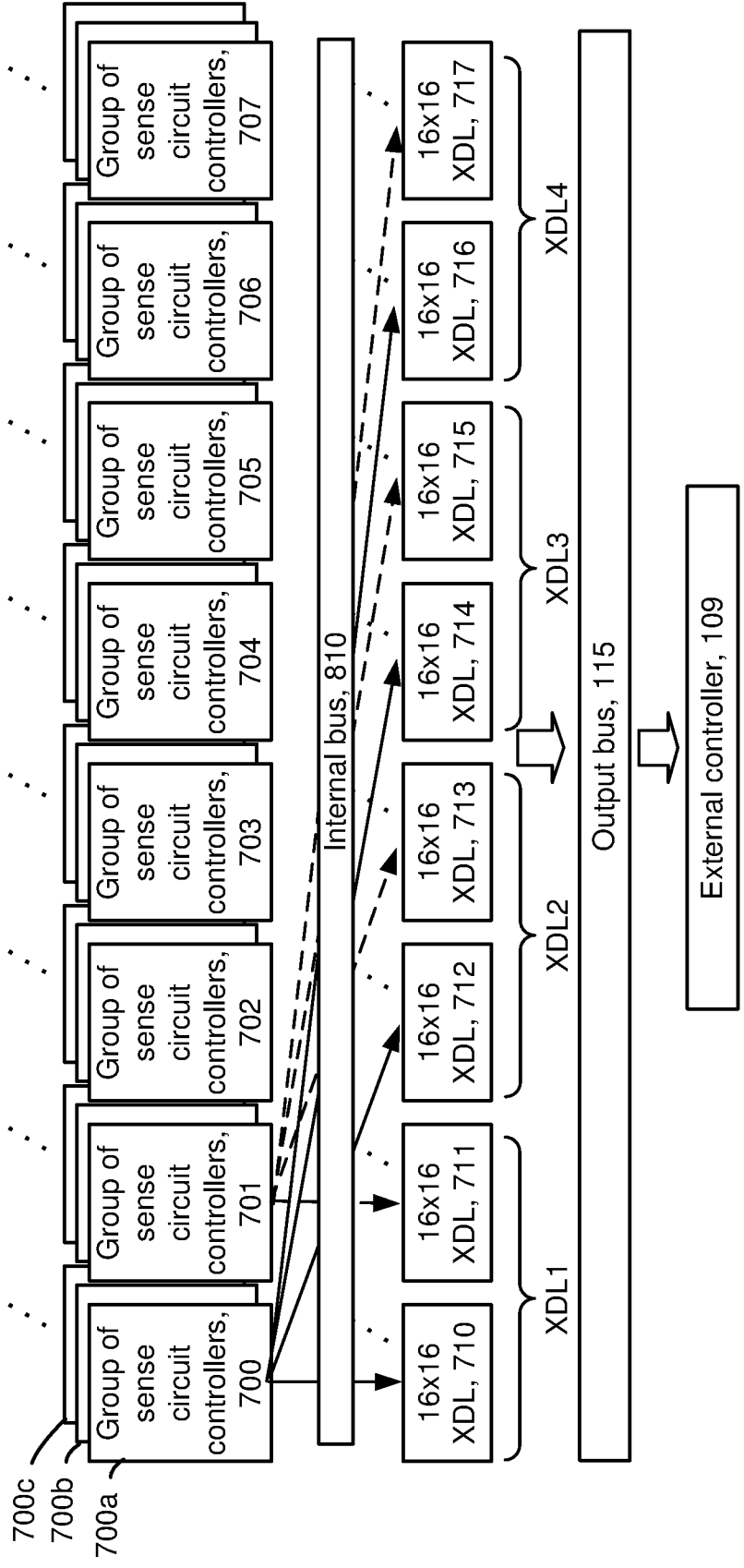

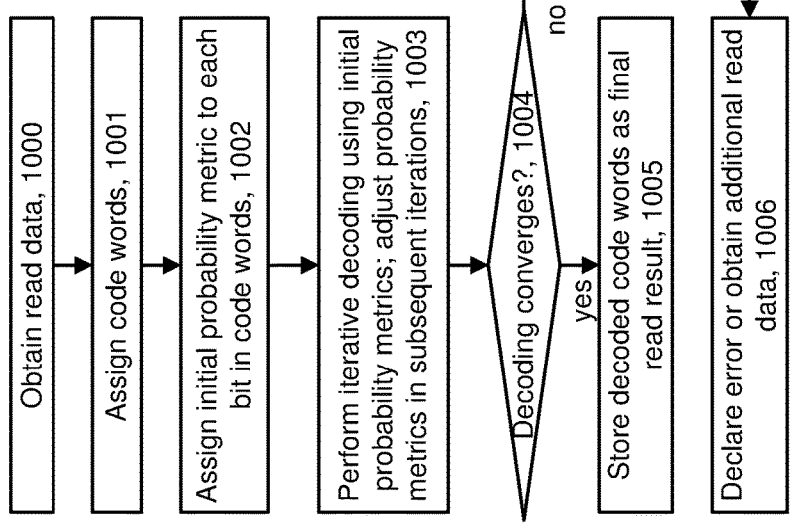

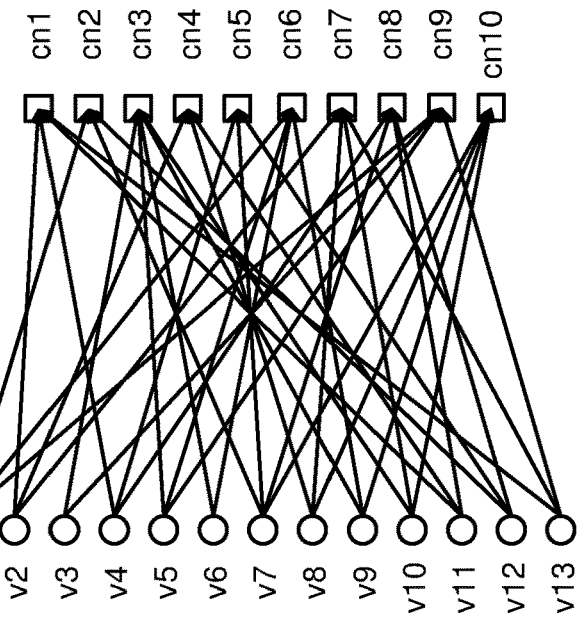
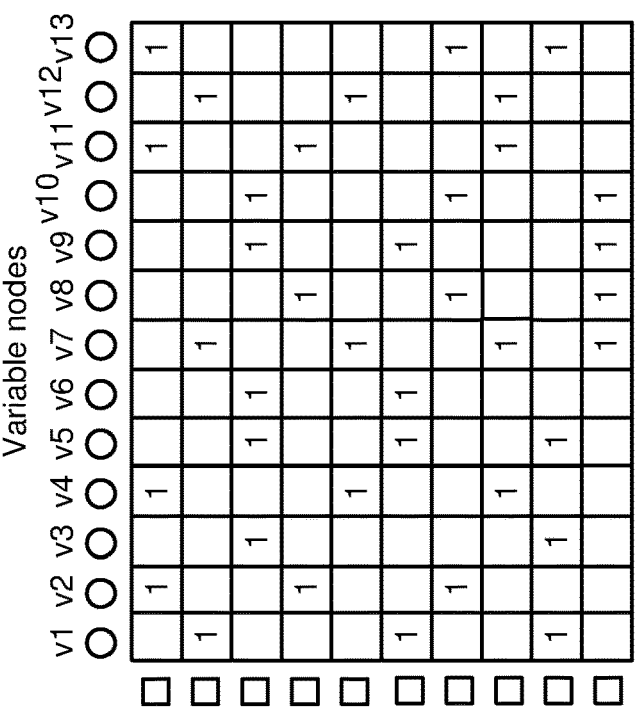

MULTI-LEVEL RECOVERY READS FOR MEMORY

BACKGROUND

The present technology relates to operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture.

However, various challenges are presented in operating such memory devices.

BRIEF DESCRIPTION OF THE DRAWINGS

FIG. 3 depicts an example block in the memory cell array 101 of FIG. 1A in a 3D configuration.

FIG. 4A depicts example Vth distributions of memory cells immediately after a program operation, where eight data states are used.

FIG. 4B depicts widening and shifting of the Vth distributions of FIG. 4A due to various effects such as disturbs and data retention loss.

FIG. 4C depicts bit sequences for different data states and for lower, middle and upper pages of data, and associated read voltages, when eight data states are used, consistent with FIGS. 4A and 4B.

FIG. 4D depicts example Vth distributions of memory cells immediately after a program operation, where four data states are used.

FIG. 4E depicts bit sequences for different data states and for lower and upper pages of data, and associated read voltages, when four data states are used, consistent with FIG. 4D.

FIG. 5A depicts an example read operation from a perspective of on-die circuitry such as the control circuitry 110 of FIG. 1A.

FIG. 5B depicts an example read operation from a perspective of an off-die controller such as the external controller 109 of FIG. 1A, consistent with the read operation of FIG. 5A.

FIG. 6C depicts waveforms used in reading an upper page of data using four word line voltages, consistent with the processes of FIG. 5A to 5F.

FIG. 6D depicts waveforms used in reading data using one word line voltage, consistent with the processes of FIG. 5A to 5F.

FIG. 6E depicts waveforms used in performing a baseline read followed by a recovery read using two series of the waveforms of FIG. 6A.

FIG. 7B depicts groups of sense controllers which transfer first-fourth read data to first-fourth sets of output latches XDL1-XDL4, respectively.

FIG. 8C depicts an example block diagram of the sense circuits 800a and 800b of FIG. 8A and the associated sense circuit controller 700a.

FIG. 10 depicts an example LDPC decoding process as an example of the decoding process in FIG. 5B, step 512, and FIG. 5H, step 542.

FIG. 11A depicts a table which provides multi-bit code words for different data states, consistent with FIG. 10, step 1001.

FIG. 11B depicts a table of initial values of LLRs for each bit of the code words of FIG. 11A based on first read data from sensing relative to a first read threshold, as one example implementation of FIG. 10, step 1002.

FIG. 11C depicts a table of initial values of LLRs for each bit of the code words of FIG. 11A based on first and second read data from sensing relative to first and second read thresholds, respectively, as another example implementation of FIG. 10, step 1002.

FIG. 12A depicts an example sparse parity check matrix in an LDPC decoding process, in an example implementation of FIG. 10, step 1003.

FIG. 12B depicts a sparse bipartite graph which corresponds to the sparse parity check matrix of FIG. 12A.

DETAILED DESCRIPTION

Figure 1:
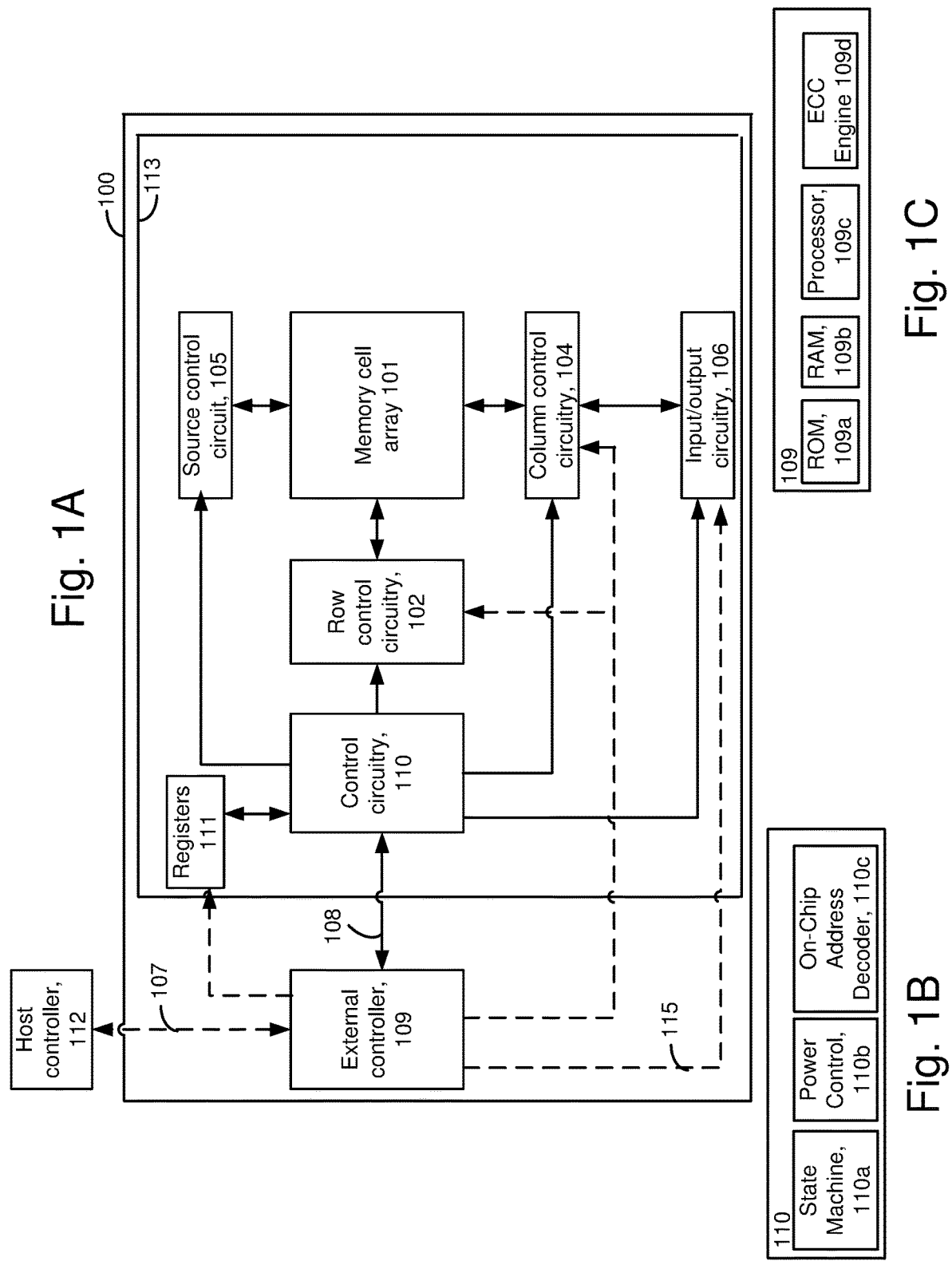
FIG. 1A is a block diagram of an example storage system in which an external controller communicates with control circuitry on one or more memory die 113.
FIG. 1B is a block diagram of an example of the control circuitry 110 of FIG. 1A.
FIG. 1C is a block diagram of an example of the external controller 109 of FIG. 1A.

Read operations are provided for a memory device which efficiently provide baseline read data and recovery read data.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control line (e.g., word line) which acts a control gate. A set of word lines extends from the source side of a block to the drain side of a block.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations. Verify operations may be performed after each program voltage to determine whether the memory cells have completed programming. When programming is completed for a memory cell, it can be locked out from further programming while programming continues for other memory cells in subsequent program loops. In another option, the programming of a block occurs one sub-block at a time.

Each memory cell may be associated with a data state according to write data in a program command. Based on its data state, a memory cell will either remain in the erased state or be programmed to a data state (a programmed or target data state) different from the erased state. For example, in a two-bit per cell memory device, there are four data states including the erased state and three programmed data states referred to as the A, B and C data states. See FIG. 4D. In a three-bit per cell memory device, there are eight data states including the erased state and seven programmed data states referred to as the A, B, C, D, E, F and G data states. See FIG. 4A. In a four-bit per cell memory device, there are sixteen data states including the erased state and fifteen programmed data states referred to as the S0, S1, S2, S3, S4, S5, S6, S7, S8, S9, S10, S11, S12, S13, S14 and S15 data states. Moreover, the write data may be represented by pages of data, where each bit stored in a memory cell is in a different page.

The data which is stored in a memory cell can be read in a read operation. In a read operation, one or more control gate voltages are applied to a set of memory cells connected to a selected word line while sense circuits determines whether the memory cells are in a conductive or non-conductive state. The threshold voltage (Vth) of a memory cell can therefore be determined and associated with a particular data state.

However, various difficulties can be encountered when reading memory cells. For example, after programming, the Vth distributions of the memory cells can be widened and/or shifted over time. In some cases, disturbs such as read disturbs tend to increase the Vth distribution. On the other hand data retention loss tends to decrease the Vth distribution. As a result, the Vth of some memory cells can shift to an extent that a read error occurs. The shift can be large enough that uncorrectable errors results even with an error correcting code (ECC). One possible solution is to re-read the memory cells with different control gate read voltages in a recovery read. However, this process is time-consuming since a recovery read typically involves more sense operations than the original, baseline read. Additionally, there is a delay in the external controller decoding the baseline read data before requesting the recovery read data.

Techniques provided herein address the above and other issues. In one aspect, on-die circuitry, which is on a die with an array of memory cells, obtains recovery read data before it is requested or needed by an external, off-die controller. The recovery read data is therefore obtained pre-emptively in preparation for a recovery read command. In another aspect, data from multiple reads is obtained and made available in a set of output latches for retrieval by the off-die controller. This approach is suitable, e.g., for use in a low density parity check (LDPC) decoding process in which initial probability metrics are based on multiple reads. Read data relative to multiple read thresholds is obtained and transferred from latches associated with the sense circuits to the set of output latches. The read data relative to multiple read thresholds can be stored and held concurrently in the set of output latches for retrieval by the off-die controller.

These and other features and benefits are described below.

FIG. 1A is a block diagram of an example storage system or memory device 100 in which an external controller communicates with control circuitry on one or more memory die 113. A host controller 112 communicates with an external controller 109 via a bus 107. The external controller, which can be a microcontroller, in turn can communicate with the one or more memory die. The external controller is external to the memory die and is therefore also referred to as an off-die controller. Multiple communication paths such as buses can be provided between the external controller and control circuitry which is on each die. For example, a communication path 108 is provided between the external controller 109 and the control circuitry 110, and a bus 115 is provided between the external controller 109 and the column control circuitry, which can include an output set of latches from which read data can be retrieved. The control circuitry 110 acts as an interface between the memory cell array 101 and the external controller. The external controller may also communicate with registers 111 to set values which indicate read voltages. These value can specify baseline read voltages, and/or recovery read voltages. The recovery read voltages can be specified based on shifts, e.g., upshifts and/or downshifts, from the baseline read voltages. The control circuitry 110 can communicate with the registers to read the values to determine read voltages to apply to a selected word line in a selected block in which a read operation takes place.

The bus 115 can have an external ready or busy status which is set by the control circuitry 110. See also FIG. 6A to 6D. In one possible option, the external controller can access a ready/busy pin of the control circuitry via an auxiliary channel to determine the ready/busy status. In another possible option, the external controller accesses the ready/busy status via the same communication path over which it communicates commands and data. When the control circuitry is ready, the external controller determines that it is able to send commands and data to the control circuitry, and that the control circuitry is waiting to receive such commands, address and data. When the control circuitry is busy, the external controller waits to send most commands and data to the control circuitry. Commands for suspending and resuming tasks can be provided from the external controller to the control circuitry when the status is ready or busy, but may not be acted on by the control circuitry immediately when the status is busy. Check status commands can also be provided from the external controller to the control circuitry when the status is ready or busy.

The external controller can thus communicate with the control circuitry at any time, even when the busy status is set for the communication path. In one approach, the external controller 109 provides a manual suspend or resume command to the control circuitry and provides other commands and data to, and receives data from, the control circuitry. The control circuitry 110 can communicate with the memory cell array via a respective communication path which is internal to the memory chip. This internal communication path can have an internal ready or busy status. A suspend status can indicate whether a task is currently suspended by the control circuitry.

The commands provided to the control circuitry can include a manual suspend command a manual resume command, a program command, a read command, an erase command, and a check status command. The data provided to the control circuitry by the external controller can include program data which is to be written to memory cells. The data received by the external controller from the control circuitry can include read data which was read from memory cells, and status data which includes a task status and a suspend status. The read data can include baseline read data and recovery read data as described further below. The status data can be returned in response to a check status command from the external controller. The status data can be a byte of data, for instance, in which the bit positions and values have pre-assigned meanings. In one approach, the byte identifies one or more planes which are ready to output data, when a memory cell array is provided in multiple planes.

The task status can indicate whether a task has been successfully completed by the control circuitry, e.g., using a pass/fail indication, as well as providing a progress of the task. The progress of a program task, for instance, could indicate whether memory cells which are to be programmed to a certain target data state (e.g., A-state, B-state, . . . ) have completed programming. The task status can be for a previous task or a current task. The task status can indicate a type of the task, including multilevel cell (MLC), i.e., multi-bit cell, erasing or programming, or single level cell (SLC), i.e., single-bit cell, erasing or programming. An MLC read task uses two or more control gate/word line voltages to distinguish between three or more data states, while an SLC read task uses one control gate/word line voltage to distinguish between only two data states. An MLC program task uses two or more verify voltages to program a set of memory cells to two or more data states, while an SLC program task uses one verify voltage to program a set of memory cells to only one data state. A read operation can be made up of one or more read tasks, and a program operation can be made up of one or more program tasks. Each task of a read operation can involve reading a page of data. A program task can involve a transfer or write data from the external controller to caches or output latches of the memory die, and a read task can involve a transfer of read data from the output latches to the external controller.

The memory cells in the memory cell array may be arranged in a 2D or 3D memory structure, for example. Row control circuitry 102, column control circuitry 104 and a source control circuit 105 are associated with the memory cell array 101.

The memory cell array comprises a set of bit lines which is common to multiple blocks of the array. The row control circuitry has the ability to concurrently supply a voltage on each word line of a selected block. For example, a program or read voltage can be provided on a selected word line while a pass voltage is provided on unselected word lines. The column control circuitry has the ability to concurrently supply a voltage on each bit line. Also, the column control circuitry includes sense blocks, e.g., sense circuitry for sensing, via the bit lines, the conductive state of memory cells connected to a selected word line in a selected block. The column control circuitry 104 communicates with input/output circuitry 106, which may include input/output paths, logic circuits and buses. The input/output circuitry in turn communicates with the external controller.

Commands and data are transferred between the host controller 112 and the external controller 109 via the data bus 107, and between the external controller and the control circuitry via a path 108. Other paths (represented by dashed lines) allow the external controller to communicate with the row control circuitry, column control circuitry and input/output circuitry. Other paths (represented by solid lines) allow the on-die control circuitry to communicate with the source control circuits, row control circuitry, column control circuitry and input/output circuitry.

Generally, in a program operation, write data is transferred from the host controller to the external controller, then to the input/output circuitry, and then to the column control circuitry for programming into a selected word line. In a read operation, read data is read from a selected word line, stored in the column control circuitry, and then transferred to the input/output circuitry, the external controller and finally the host controller. In some cases, a program or read is performed by the external controller without a program or read command from the host controller, such as to transfer data between blocks or word lines.

The memory structure in each plane can be 2D or 3D. The memory structure may comprise one or more arrays of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

In some implementations, some of the components can be combined. In various designs, one or more of the components (alone or in combination), other than planes, can be thought of as at least one control circuit which is configured to perform the techniques described herein including the steps of the flowcharts provided herein. For example, a control circuit may include any one of, or a combination of, the host controller 112, the external controller 109, the control circuitry 110, the row and column control circuitry, the source control circuits, and the input/output circuits.

FIG. 1B is a block diagram of an example of the control circuitry 110 of FIG. 1A. The control circuitry 110 includes a state machine 110a, a power control module 110b and an on-chip address decoder 110c. The state machine provides chip-level control of memory operations. The state machine, also referred to as a finite state machine, is an abstract machine that can be in one of a finite number of states. In one approach, the machine is in only one state at a time, and can transition from one state to another when initiated by a triggering event or condition. A particular state machine can be defined by a list of its states, and the triggering condition for each transition. A state machine may be implemented, e.g., using a programmable logic device, a programmable logic controller, logic gates and flip flops or relays. A hardware implementation may use a register to store state variables, a block of combinational logic that determines the state transition, and a second block of combinational logic that determines the output of the state machine. A state machine can carry out lower-level processes relative to the external controller in a space-efficient manner.

The state machine is configured to interface the external controller to multiple planes, e.g., the first plane and the second plane, to set a busy status when the first and second circuitry of the first and second planes, respectively, are not ready to output data to the external controller, and to subsequently set a ready status when the first or second circuitry is ready to output data to the external controller. The state machine can also include a logic block which is used to read values from the registers and derive read voltages from the values.

The power control module 110b controls the power and voltages supplied to the word lines and bit lines during memory operations. It can include drivers for word lines, SGS and SGD transistors, source lines and bit lines. The sense blocks can include bit line drivers, in one approach. An SGS transistor is a select gate transistor at a source end of a NAND string, and an SGD transistor is a select gate transistor at a drain end of a NAND string. The on-chip address decoder provides an address interface between addresses used by the host controller or the external controller to the hardware addresses used by the row and column control circuitry.

FIG. 1C is a block diagram of an example of the external controller 109 of FIG. 1A. The external controller 109 may comprise a processor 109c, storage devices (memory) such as ROM 109a and RAM 109b and an error-correction code (ECC) engine 109d. The ECC engine can correct up to a specified number of read errors.

The storage device comprises code such as a set of instructions, and the processor is operable to execute the set of instructions to provide the functionality described herein. Alternatively or additionally, the processor can access code from the memory structure, such as a reserved area of memory cells in one or more word lines.

For example, code can be used by the controller to access the memory cell array such as for programming, read and erase operations. The code can include boot code and control code (e.g., set of instructions). The boot code is software that initializes the controller during a booting or startup process and enables the controller to access the memory structure. The code can be used by the controller to control one or more memory structures. Upon being powered up, the processor 109c fetches the boot code from the ROM 109a or storage area for execution, and the boot code initializes the system components and loads the control code into the RAM 109b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below.

In one embodiment, the host controller is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host controller may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure. In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

Two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
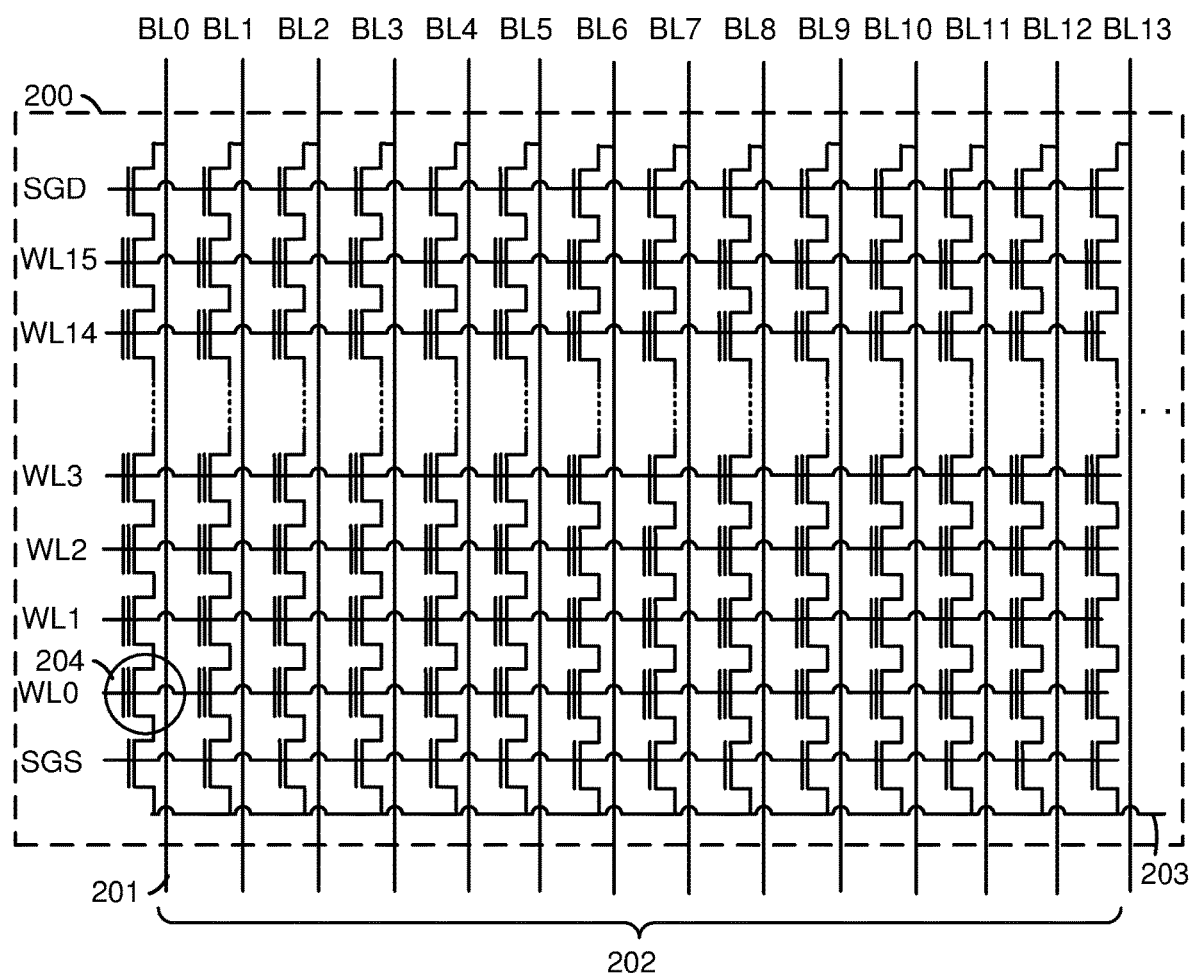
FIG. 2 depicts an example block in the memory cell array 101 of FIG. 1A in a 2D configuration.

FIG. 2 depicts an example block in the memory cell array 101 of FIG. 1A in a 2D configuration. The block 200 includes a set 202 of NAND strings (including an example NAND string 201 with an example memory cell 204) and respective bit lines, e.g., BL0, BL1, . . . which are shared among multiple blocks in a plane. Each NAND string is connected at one end to a drain select gate (SGD), and the control gates of the drain select gates are connected via a common SGD line. The NAND strings are connected at their other end to a source select gate which, in turn, is connected to a common source line 203. Sixteen word lines, for example, WL0-WL15, extend between the source select gates and the drain select gates. In some cases, dummy word lines, which contain no user data, can also be used in the memory array adjacent to the select gate transistors. Such dummy word lines can shield the edge data word lines from certain edge effects.

One type of non-volatile memory which may be provided in the memory array is a floating gate memory. Other types of non-volatile memory can also be used. For example, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The memory cell is programmed by injecting electrons from the memory cell channel into the nitride, where they are trapped and stored in a limited region. This stored charge then changes the threshold voltage of a portion of the channel of the memory cell in a manner that is detectable. The memory cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3 depicts an example block 300 in the memory cell array 101 of FIG. 1A in a 3D configuration. In one possible approach, the length of the memory cell array, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

The block includes vertically-extending NAND strings which are arranged in sub-blocks SB0-SB3. Example NAND strings 301, 302 and 303 are provided in sub-blocks SB0, SB1 and SB2, respectively. SB3 includes example NAND strings 304-311. The block includes 48 word lines, WL0-WL47, in this example. Each sub-block comprises a set of NAND strings which extend in the x direction and which have a common SGD line, e.g., SGD0, SGD1, SGD2 or SGD3. In this simplified example, there is only one SGD transistor and one SGS transistor in each NAND string. The SGS transistors are separate in each sub-block in this example and include SGS0-SGS3 in SB0-SB3, respectively.

FIG. 4A depicts example Vth distributions of memory cells immediately after a program operation, where eight data states are used. Some memory cells remain in the erased state while other memory cells are programmed to one of seven different programmed data states. The final Vth distribution can be achieved by using one or more programming passes. Each pass may use incremental step pulse programming, for instance. During a programming pass, program-verify iterations are performed for a selected word line. A program-verify iteration comprises a program portion in which a program voltage is applied to the word line followed by a verify portion in which one or more verify tests are performed. Each programmed state has a verify voltage which is used in the verify test for the state. For example, the verify voltages of the A, B, C, D, E, F and G states are VvA, VvB, VvC, VvD, VvE, VvF and VvG, respectively. The Er, A, B, C, D, E, F and G states are represented by the Vth distributions 400, 401, 402, 403, 404, 405, 406 and 407, respectively, and an example encoding of bits for each state is 111, 110, 100, 000, 010, 011, 001 and 101, respectively. The baseline read voltages VrA, VrB, VrC, VrD, VrE, VrF and VrG are also depicted. The baseline read voltages are non-recovery read voltages and are used in the initial, baseline attempt to read data, before a determination is made that the data contains an uncorrectable error. When the baseline read data contains an uncorrectable error, it is desirable to obtain recovery read data which is obtained using recovery read voltages such as depicted in FIG. 4B.

FIG. 4B depicts widening and shifting of the Vth distributions of FIG. 4A due to various effects such as disturbs and data retention loss. Over time, after multiple read operations are performed on a block, the Vth distributions can change in a way which leads to read errors. The Vth distributions can change due to data retention loss (which may be a function of temperature or other environmental conditions), aging of the memory cells, and voltage disturbs from the read or program activity of neighboring memory cells, for instance. In this example, the Vth distributions 400-407 of FIG. 4A transitions to the Vth distributions 410-417, respectively. For example, the upper tail of the Er-state Vth distribution 410 has increased above VrA and the corresponding memory cells will therefore be read incorrectly as being in the A state. Similarly, the lower tail of the A-state Vth distribution 411 has decreased below VrA and the corresponding memory cells will therefore be read incorrectly as being in the Er state. Memory cells in other states may also result in read errors.

The baseline read voltages are set at an expected valley or demarcation point between the Vth distributions of adjacent data states. As two adjacent Vth distributions change, the valley between them also changes. The valley can be shifted higher or lower than the baseline read voltage. One approach to a recovery read is to read the memory cells relative to the upshifted and downshifted voltages. For example, for the baseline read voltage of VrA, VrB, VrC, VrD, VrE, VrF and VrG, the upshifted read voltages are VrAu, VrBu, VrCu, VrDu, VrEu, VrFu and VrGu, respectively, and the downshifted read voltages are VrAd, VrBd, VrCd, VrDd, VrEd, VrFd and VrGd, respectively. The upshift and/or downshift can be the same or different for each baseline read voltage. Moreover, for a given baseline read voltage, the upshift can be the same or different than the downshift.

Further, it is possible to perform a recovery read using more than one upshift and/or more than one downshift for a given baseline read voltage. For example, for VrA, additional upshifted and downshifted read thresholds of VrAu2 and VrAd2, respectively, are depicted. For simplicity, the additional upshifted and downshifted read thresholds are not depicted for the other baseline read voltages. It is also possible to perform a recovery read for a subset of all baseline read voltages. For example, a recovery read may focus on VrA and the valley between the Er and A state Vth distributions since disturbs often affect the Er-state memory cells most severely. This recovery read distinguishes between the two lowest data state, including the erased state and the lowest programmed state (the A state). A recovery read may be omitted for a highest baseline read voltage such as VrG, in one example. This omitted recovery read is associated with the two highest programmed data states, e.g., the F and G states.

Various approaches are possible for obtaining the recovery read data. In one approach, a fixed word line voltage is applied while the Vth of a memory cell is sensed relative to the shifted read thresholds, concurrently or in sequence. The Vth of a memory cell can be sensed relative to the shifted read thresholds using different reference comparison voltages (see FIG. 9A and Vref-Vref3), for instance. In another possible approach, the Vth of a memory cell can be sensed relative to the shifted read thresholds using different voltage decay times (see FIG. 9C) in a sense circuit. Another possible approach is to vary the word line voltage during the sensing relative to the shifted read thresholds. Other approaches perform the sensing while the word line voltage is gradually ramped up or down.

FIG. 4C depicts bit sequences for different data states and for lower, middle and upper pages of data, and associated read voltages, when eight data states are used, consistent with FIGS. 4A and 4B. Generally, data is programmed and read in units of pages, and each memory cell can store bits of multiple pages. Here, the memory cells each store three bits of data in one of eight data states. Example bit assignments for each state are depicted. A lower, middle or upper bit can represent data of a lower, middle or upper page, respectively. Seven programmed data states A, B, C, D, E, F and G are used in addition to the erased state, Er. With these bit sequences, the data of the lower page can be determined by reading the memory cells using baseline read voltages (e.g., control gate or word line voltages) of VrA and VrE. The lower page (LP) bit=1 if Vth<=VrA or Vth>VrE.

LP=0 if VrA<Vth<=VrE. Generally, a memory cell can be sensed by sense circuitry while a read voltage is applied. If the memory cell is in a conductive state, its threshold voltage (Vth) is less than the read voltage. If the memory cell is in a non-conductive state, its Vth is greater than the read voltage.

The read voltages which are used to read a page of data are determined by transitions from 0 to 1 or 1 to 0 in the encoded bits (code word) for each state. For example, the LP bit transitions from 1 to 0 between Er and A, and from 0 to 1 between D and E. Accordingly, the read voltages for the LP are VrA and VrE.

The data of the middle page can be determined by reading the memory cells using read voltages VrB, VrD and VrF. The middle page (MP) bit=1 if Vth<=VrB or VrD<Vth<=VrF. MP=0 if VrB<Vth<=VrD or Vth>VrF. For example, the MP bit transitions from 1 to 0 between A and B, from 0 to 1 between C and D, and from 1 to between E and F. Accordingly, the read voltages for the MP are VrB, VrD and VrF.

The data of the upper page can be determined by reading the memory cells using read voltages of VrC and VrG. The upper page (UP) bit=1 if Vth<=VrC or Vth>VrG. UP=0 if VrC<Vth<=VrG. For example, the UP bit transitions from 1 to 0 between B and C, and from 0 to 1 between F and G. Accordingly, the read voltages for the UP are VrC and VrG.

In one approach, a memory cell is sensed relative to different read thresholds, one read threshold at a time. In another approach, a memory cell is sensed relative to multiple read thresholds concurrently.

In one approach, a single page is read and output to the external controller and decoded. If the decoding results in errors, a recovery read can be performed for that page. When the recover read is successful, e.g., the page is read with no uncorrectable errors, the next page can be read. If the recovery read is unsuccessful, e.g., the page cannot be read without uncorrectable errors, one option is to try to read the next page. Another option is to mark the block as being bad.

FIG. 4D depicts example Vth distributions of memory cells immediately after a program operation, where four data states are used. The data states are represented by Vth distributions 420, 421, 422 and 423 for the Er, A, B and C states, respectively, and an example encoding of bits for each state is 11, 10, 00 and 01, respectively, in the format of upper page (UP) bit/lower page (LP) bit. The verify voltages are VvA, VvB and VvC, and the baseline read voltages are VrA, VrB and VrC. A LP read may use VrA and VrC and an UP read may use VrB. Recovery read voltages are not depicted but may be similar to what was shown and discussed in connection with FIG. 4B.

FIG. 4E depicts bit sequences for different data states and for lower and upper pages of data, and associated read voltages, when four data states are used, consistent with FIG. 4D. The data of the lower page can be determined by reading the memory cells using VrA and VrC. The lower page (LP) bit=1 if Vth<=VrA or Vth>VrC. LP=0 if VrA<Vth<=VrC. The LP bit transitions from 1 to 0 between Er and A, and from 0 to 1 between B and C, so that the read voltages for the LP are VrA and VrC. The data of the upper page can be determined by reading the memory cells using VrB. The upper page (UP) bit=1 if Vth<=VrB and LP=0 if Vth>VrB. The UP bit transitions from 1 to 0 between A and B, so that the read voltage for the UP is VrB.

FIG. 5A depicts an example read operation from a perspective of on-die circuitry such as the control circuitry 110 of FIG. 1A. At step 500, the on-die circuitry receives a baseline read command from the off-die controller. At step 501, the on-die circuitry executes the command to obtain baseline read data. At step 502, the on-die circuitry obtains recovery read data. In one approach, the recovery read data is obtained even though the off-die controller did not explicitly request it, e.g., in a dedicated read recovery command. The on-die circuitry may obtain the recovery read data in preparation for a request for the recovery read data from the off-die controller. In one approach, the on-die circuitry may begin to obtain the recovery read data while the off-die controller is retrieving and/or decoding the baseline recovery read data. At step 503, the on-die circuitry signals that baseline read data is ready for output. This may involve setting the ready/busy signal to ready, as in FIG. 6A at t5, FIG. 6B at t6, FIG. 6C at t7 and FIG. 6D at t4.

In one option, at step 504, the on-die circuitry receives a recovery read command from the off-die controller. This could be a separate read command than the earlier baseline read command, in one approach. At step 505, the on-die circuitry signals that recovery read data is ready for output. This may involve setting the ready/busy signal to ready again. The on-die circuitry sets the ready/busy signal to busy when the on-die circuitry is reading the memory cells and transferring read data to the output latches, in one approach. Step 504 and 505 could be repeated one or more times if the off-die controller desires to have additional read recovery data. The read process is done at step 506.

In another option, after step 503, the on-die circuitry does not receive a recovery read command from the off-die controller and the read process is done at step 506.

There are various ways in which the off-die controller can communicate with the on-die circuitry to obtain data. One option, depicted by steps 511 and 515, involves polling in which the off-die controller issues a read command, repeatedly polls the on-die circuitry to see if the requested read data is ready for output and transfers out the read data when the on-die circuitry indicates the read data is ready. Another option, depicted by steps 511a and 515a, involves knowledge of the amount of time it normally takes for the read data to be ready for output after issuing a read command. For example, if the off-die controller knows that it normally takes 50 μsec. for read data to be ready for output, it can issue a read command, wait for a period of time which is slightly longer than the expected time for the read data to be ready, e.g., 55 μsec., then transfer out the read data after the period of time. This approach avoids repeated polling. At step 511a, the off-die controller retrieves the baseline read data or other first read data after a first time period, e.g., 55 μsec., and at step 515a, the off-die controller retrieves the recovery read data or other second read data after a second time period, e.g., 40 μsec. which is less than the first time period. The off-die controller uses the knowledge that the recovery read data or other second read data will be available for output from the output data latches more quickly than normal read data or other first read data.

The techniques provided herein provide a number of advantages in terms of handling recovery read operations. In a memory device, an initial or baseline request to read data can fail due to insufficient ECC protection for the device. The ECC protection should take into account the number of error bits which are expected to accumulate since the time the device was programmed. For example, in some applications, data may be stored for a relatively long time before it is read. Errors can accumulate during this time due to data retention loss and other factors.

A read failure can be handled in many ways. One approach is to use a higher level of ECC protection, such as full die protection. However, this results in higher overhead costs. Another approach is to perform a recovery read, where the memory cells are re-read using recovery read thresholds which are different than the baseline read thresholds. For example, upper and lower recovery read thresholds may be used which are shifted higher and lower, respectively, relative to a baseline read threshold. However, this results in a time penalty. Specifically, the reading of data with different read thresholds generally involves the external controller setting the read thresholds, issuing a command for a read operation and transferring the resulting read data out of the die. Moreover, additional time is used if a separate control gate voltages are used for the upper and lower recovery read thresholds.

Techniques provided herein can reduce the time needed for an external controller to obtain recovery read data while also reducing the number of commands it sends to the die, allows the reading to occur in parallel. The techniques can also reduce transients, e.g., changes in the control gate voltage, and delays since the control gate voltage only needs to be set up and stabilized once to perform multiple read senses. The delay in obtaining recovery data can be reduced to the time of transferring of the data, in some cases. In addition to a recovery read, the techniques support other reading operations such as voltage sweeps, where the memory cells are read using a series of closely spaced read thresholds which extend across the Vth distributions from the lowest to the highest data state, for instance.

The techniques also reduce the effects of read disturb (read noise) by performing multiple read senses concurrently or nearly concurrently. Read disturbs can cause the Vth of a memory cell to vary when it is read at different times. In particular, each time a read voltage is applied to a selected memory cell, the selected memory cell and neighboring memory cells can be disturbed. By performing sensing relative to multiple read thresholds during one read voltage, read disturbs can be reduced and the accuracy of the sensing is improved.

In one approach, a relationship is provided between the external controller and the on-die circuitry such that a command to perform a baseline read operation will also trigger a recovery read operation. If the recovery read operation is not needed by the external controller to successfully decode (e.g., decode with no uncorrectable errors) the baseline read data, the recovery read data can be discarded. The discarding may include resetting the output latches and not outputting the recovery read data from the output latches to the external controller. This saves the time which would otherwise be used to transfer the data on a bus to the external controller.

The baseline read command can include information regarding the recovery read thresholds, such as one or more offsets from the baseline read thresholds, above and/or below the baseline read thresholds.

Once the baseline and recovery read data is obtained, it can be stored in various locations on the die. In one configuration, an output buffer or set of latches is sized to store one bit from each memory cell of a word line. If multiple bits of read data are obtained from each memory cell, the read operation can be limited to a portion of all of the memory cells connected to the word line, to ensure sufficient room in the set of latches to store the read data. For example, if two bits of read data (e.g., first and second read data) are obtained from each memory cell, the read operation can be limited to one half of the memory cells connected to the word line. Further, the first read data can be stored in one portion of the set of output latches while the second read data is stored in another portion of the set of output latches. Another option is to provide a complete set of output latches for each bit of read data per memory cell.

In another example, two bits of read data are obtained from each memory cell, and the read operation is limited to one fourth of the memory cells connected to the word line. In this case, the first read data and second read data can be stored in adjacent or non-adjacent portions of the set of output latches. In one approach, the read command identifies the portions of the output latches to use to store the read data, which can include baseline and/or recovery read data which is stored concurrently in the set of output latches. The portions of the output latches can be identified by addresses, for example.

In one example, 1 kB of baseline read data can be stored in the first 0-1 kB of a full sequence read buffer. The associated upshifted and downshifted recovery read data might be stored at later buffer addresses such as 1-2 kB and 2-3 kB, respectively.

In one embodiment, a read command identifies first and second portions of a set of output latches to store first and second read data, respectively.

In one option, the baseline read command includes data such as a bit which triggers the recovery reads. Further, the recovery reads might occur on a global die level, such that the decision of whether to perform the recovery read is the same for all blocks on the die. The decision can be made based on a setting in a register, for instance.

The sensing relative to the multiple read thresholds can be performed in various ways on the die. One approach involves sequential sensing of each read thresholds. Any order is possible, but a baseline read sense may be performed first, after which the die enters a read completion state. Secondly, the die may then execute the recovery reads while the baseline read data is transferring out the baseline read data to the external controller, or while the external controller is decoding the baseline read data. This secondary initiation may also be executed by a new command from the controller or by a global behavior setting in the die.

In another aspect, the pre-emptive recovery reads are not performed at the beginning of the life of the memory device, when it is fresh and less prone to read errors. However, as the memory device nears the end of life, it may initiate the recovery reads pre-emptively to avoid a quality of service degradation. This approach avoids the power consumption of the recovery reads until they are most needed. The recovery reads can be triggered based on an effective age of the memory device, the number of program-erase cycles, or other factors.

FIG. 5B depicts an example read operation from a perspective of an off-die controller such as the external controller 109 of FIG. 1A, consistent with the read operation of FIG. 5A. At step 510, the off-die controller transmits a baseline read command to the on-die circuitry. At step 511, the off-die controller receives a signal indicating that the baseline read data is ready for output and retrieves the baseline read data. For example, the signal can be in the form of the ready/busy signal transitioning to the ready state. At step 512, the off-die controller decodes the baseline read data. This can involve using one or more ECC decoding processes, for example. The ECC decoding process may be based on various types of error correcting codes, such as a block code, a convolutional code, a Bose-Chaudhuri-Hocquenghem (BCH) code, a low-density parity check (LDPC) code, a Hamming code, a turbo code or a Reed-Solomon code.

A decision step 513 determines if the decoding is successful, e.g., whether there are no uncorrectable errors. If decision step 513 is true, the process is done at step 517. If the decision step 513 is false, step 514 is reached. At step 514, the off-die controller transmits a recovery read command to the on-die circuitry. At step 515, the off-die controller receives a signal (such as the ready/busy signal transitioning to the ready state) indicating that the recovery read data (additional read data) is ready for output and retrieves the recovery read data. At step 516, the off-die controller decodes the recovery read data. Decision step 513 is then repeated. The recovery read process of steps 514-516 can be repeated when the decision step 513 is false.

In one approach, the recovery read data is decoded by itself, separate from the baseline read data. In another approach, the recovery read data is used to assist the decoding of the baseline read data such as in LDPC decoding. For example, the recovery read data can comprise soft bits while the baseline read data comprises hard bits. A soft bit may indicate a reliability of a hard bit read from a memory cell. For example, in FIG. 4B, the read data obtained from sensing the memory cells relative to the baseline read thresholds comprises hard bits, and the read data obtained from sensing the memory cells relative to the shifted read thresholds comprises soft bits. There can be upper and lower soft bits associated with a hard bit. For example, in FIG. 4A, a hard bit may be obtained based on the read threshold VrA, a lower soft bit may be obtained based on the read threshold VrAd, and an upper soft bit may be obtained based on the read threshold VrAu. Similarly, a second lower soft bit may be obtained based on the read threshold VrAd2, and a second upper soft bit may be obtained based on the read threshold VrAu2.

Soft bits may be used by a decoder (such as the ECC engine 109d of FIG. 1C) to obtain a reliability indicator such as a log-likelihood ratio (LLR) for each memory cell. The decoder may use the reliability information to guide an error correction processing to generate decoded data bits based on the received hard bits and soft bits. For example, the decoder may perform probabilistic decoding by iteratively updating bit estimates and LLRs of the bit estimates based on a prior iteration of the decoding process to converge to a most probable code word. The soft bits enable the decoder to establish more accurate initial LLRs so that the decoder can converge more quickly and more accurately. One example decoding technique which uses LLRs is LDPC decoding. See also FIG. 10.

In another possible approach, the soft bits are used to speculatively flip bits and retry ECC decoding. These soft bits are used to recover and replace portions from an XOR recovery stage. Generally in this case, there is an XOR die, and the failing code word is reconstructed from the XOR die and other die in the XOR stripe. This reconstruction would still be failing because the XOR die was corrupted. This soft information means that parts of the XOR die are used that are indicated by the soft bits. An XOR of the upper and lower soft bits can be performed in the die or in the controller. If it is done in the die, it can be done in parallel to other tasks.

In one embodiment, means are provided for obtaining hard bits of read data from the set of memory cells in response to an initial read command from an off-die controller, and means are provided for obtaining soft bits of read data from the set of memory cells in response to the initial read command and in preparation for a first recovery read command from the off-die controller. The means for obtaining the soft bits of read data obtains the soft bits of read data while the die outputs the hard bits of read data to the off-die controller, and/or while the off-die controller decodes the hard bits. Means can also be provided for obtaining additional soft bits of read data from the set of memory cells in response to a second recovery read command from the off-die controller.

Thus, in one embodiment, the presence of a read failure is a trigger for a recovery read. Other triggers may be used as well. For example, a trigger may occur based on an amount of die aging. A response to the trigger may include programming a set of memory cells and performing a detailed voltage sensing to evaluate the precision, accuracy, and position of the programming.

Another trigger may involve an evaluation of data retention. A response to the trigger may include reading a set of memory cells to determine if a refresh operation is indicated. A read operation may indicate that data can be read and corrected currently, but the Vth values may be close to levels which indicate that an uncorrectable error may occur soon. One test can determine the number of bits in error for: a standard read threshold, a high read threshold, and a low read threshold. A threshold may also be applied which indicates an acceptable number of bits in error for each of these positions. Or, a test can determine if two of the thresholds (example, low XOR with high) result in a specified number of marginal bits. In one approach, the bits from the low read threshold can be XORed with the bits from the high read threshold. A count of the resulting number of bits from the XOR (exclusive OR) operation can be used to decide whether to perform a refresh. A refresh operation can involve re-writing the data which is read from a set of memory cells back to the same set of memory cells, or to another set of memory cells.

Figure 5F:
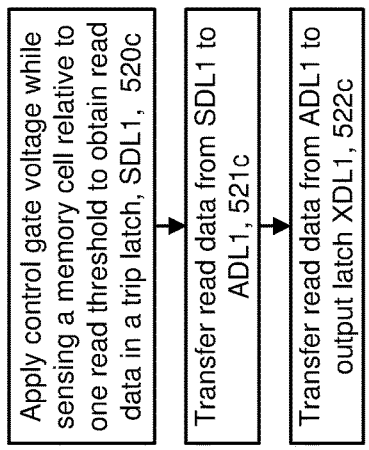
FIG. 5F depicts an alternative to steps 520-522 of FIG. 5C, for a case where read data relative to one read threshold is obtained.
Figure 5E:
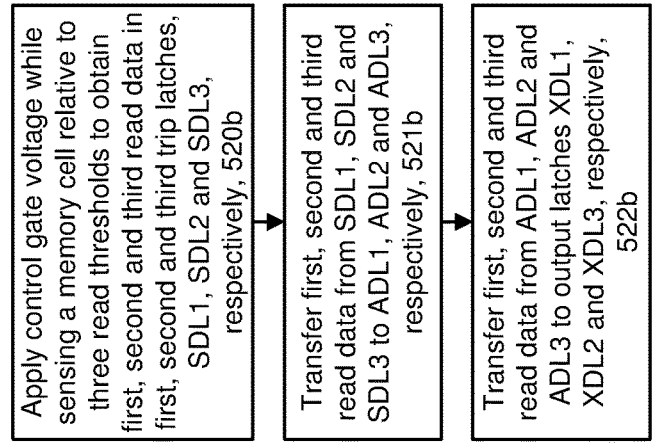
FIG. 5E depicts an example implementation of steps 520-522 of FIG. 5C, for a case where first, second and third read data are obtained.
Figure 5D:
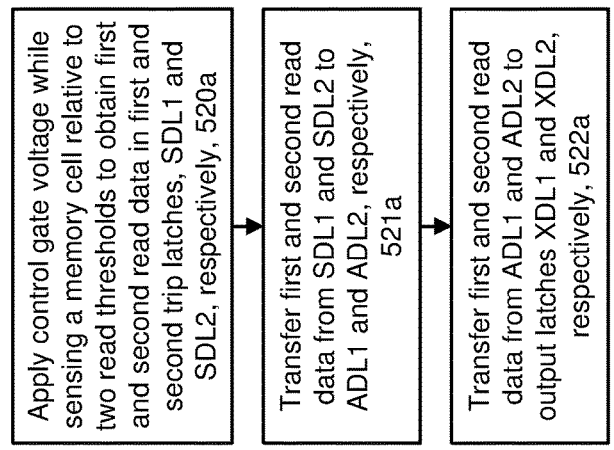
FIG. 5D depicts an example implementation of steps 520-522 of FIG. 5C, for a case where first and second read data are obtained.
Figure 5C:
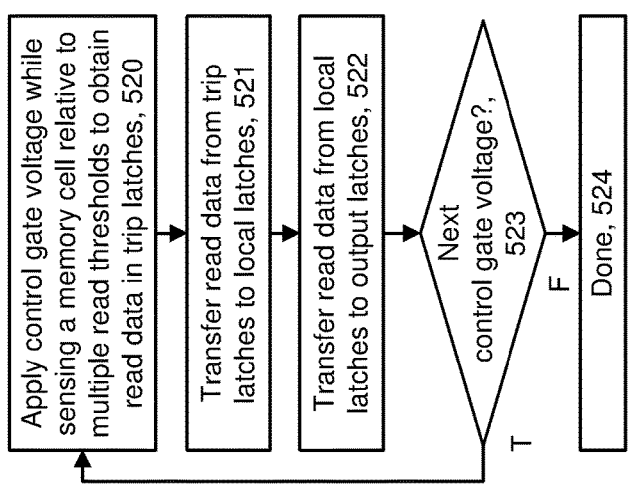
FIG. 5C depicts an example process in which on-die circuitry obtains read data consistent with steps 501 and 502 of FIG. 5A.

FIG. 5C depicts an example process in which on-die circuitry obtains read data consistent with steps 501 and 502 of FIG. 5A. Step 520 applies a control gate voltage while sensing a memory cell relative to multiple read thresholds to obtain read data in trip latches. For example, see the control gate voltages of FIGS. 6A-6D and the trip latches SDL1-SDL3 in FIG. 8C. Step 521 includes transferring the read data from the trip latches to local latches, such as ADL1-ADL4 in FIG. 8C. Step 522 includes transferring the read data from the local latches to output latches such as XDL1 and XDL2 in FIG. 7A, XDL1-XDL4 in FIG. 7B, and XDL1-XDL3 in FIG. 7C. A decision step 523 determines whether there is a next control gate voltage to apply. In one approach, the read process of FIG. 5C is for a page of data and there are one or more baseline read voltages. If the decision step 523 is false, the process is done at step 524. If the decision step 523 is true, the process begins again at step 520 with a next control gate voltage.

Figure 7A:
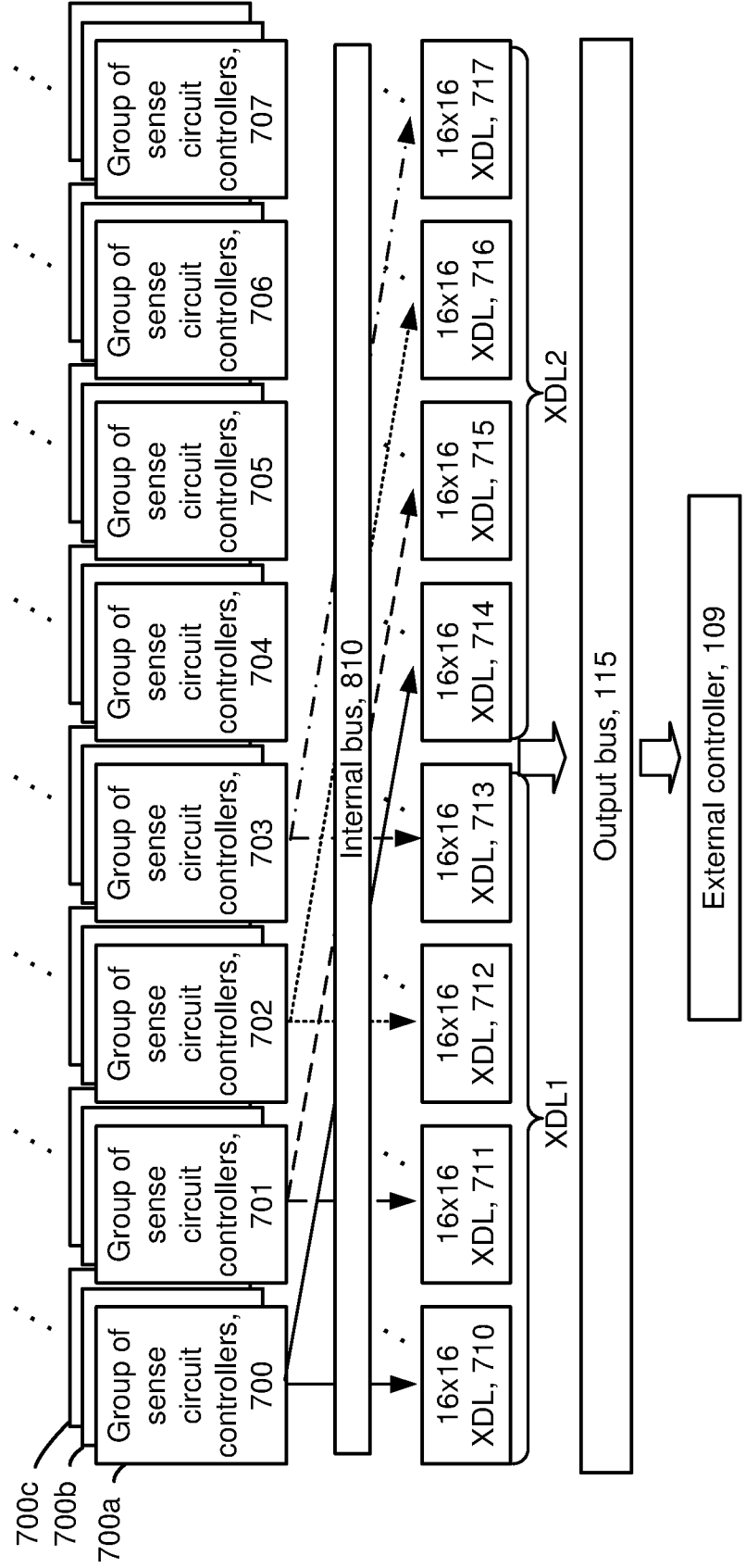
FIG. 7A depicts groups of sense controllers which transfer first and second read data to sets of output latches XDL1 and XDL2, respectively.

FIG. 5D depicts an example implementation of steps 520-522 of FIG. 5C, for a case where first and second read data are obtained. Step 520a includes applying a control gate voltage while sensing a memory cell relative to two read thresholds to obtain first and second read data in first and second trip latches, SDL1 and SDL2, respectively. See FIG. 8C. Step 521a includes transferring the first and second read data from SDL1 and SDL2 to ADL1 and ADL2, respectively. Step 522a includes transferring the first and second read data from ADL1 and ADL2 to the output latches XDL1 and XDL2, respectively (FIG. 7A).

In one approach, FIG. 5D is repeated so that first and second read data obtained using one control gate read voltage (e.g., VrC in FIG. 6A) is stored in ADL1 and ADL2, and third and fourth read data obtained using another control gate read voltage (e.g., VrG in FIG. 6A) is stored in ADL3 and ADL4. The second pass through step 522a then involves transferring the third and fourth read data from ADL3 and ADL4 to the output latches XDL3 and XDL4, respectively (FIG. 7B).

Figure 7C:
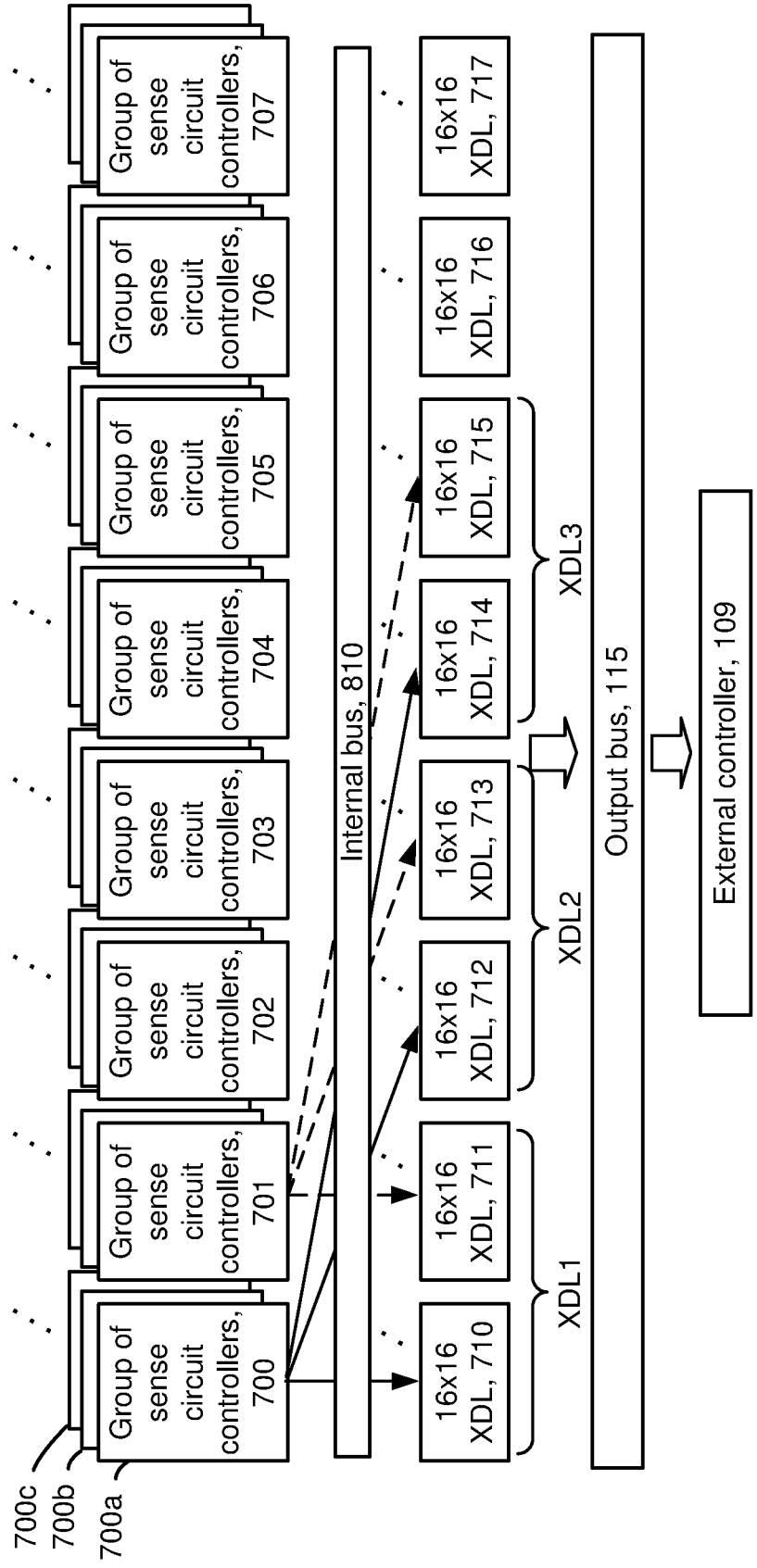
FIG. 7C depicts groups of sense controllers which transfer first-third read data to first-third sets of output latches XDL1-XDL3, respectively.

FIG. 5E depicts an example implementation of steps 520-522 of FIG. 5C, for a case where first, second, and third read data are obtained. Step 520*b* includes applying a control gate voltage while sensing a memory cell relative to three read thresholds to obtain first, second, and third read data in first, second, and third trip latches, SDL1, SDL2 and SDL3, respectively. Step 521*b* includes transferring the first, second, and third read data from SDL1, SDL2, and SDL3 to ADL1, ADL2, and ADL3, respectively. Step 522*b* includes transferring the first, second and third read data from ADL1, ADL2, and ADL3 to the output latches XDL1 XDL2, and XDL3, respectively (FIG. 7C).

FIG. 5F depicts an alternative to steps 520-522 of FIG. 5C, for a case where read data relative to one read threshold is obtained. Step 520*c* includes applying a control gate voltage while sensing a memory cell relative to one read threshold to obtain read data in a trip latch, SDL1. Step 521*c* includes transferring read data from SDL1 to ADL1. Step 522*c* includes transferring the read data from ADL1 to an output latch XDL1.

The processes of FIG. 5D-5F may be repeated for each of multiple control gate voltages in a read operation.

Figure 5H:
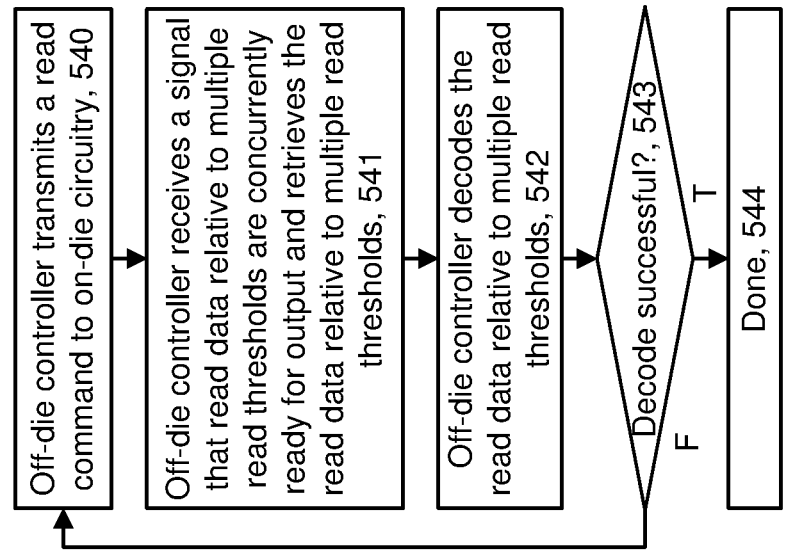
FIG. 5H depicts another example read operation from a perspective of an off-die controller such as the external controller 109 of FIG. 1A, consistent with the read operation of FIG. 5G.
Figure 5G:
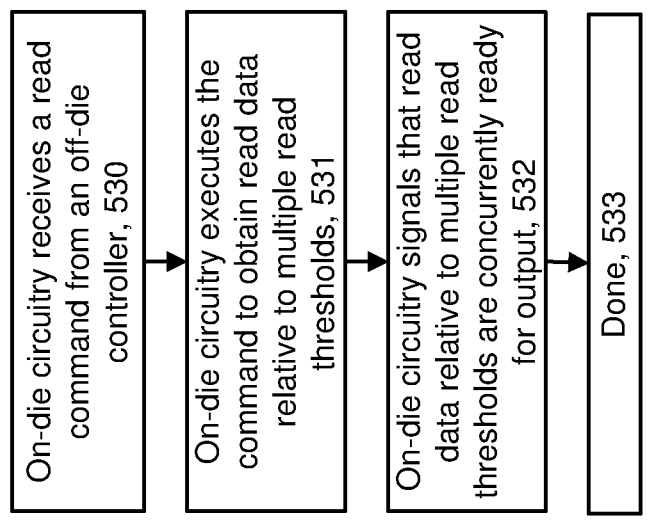
FIG. 5G depicts another example read operation from a perspective of on-die circuitry such as the control circuitry 110 of FIG. 1A.

FIG. 5G depicts another example read operation from a perspective of on-die circuitry such as the control circuitry 110 of FIG. 1A. In this example, at step 530, the on-die circuitry receives a read command from an off-die controller. At step 531, the on-die circuitry executes the command to obtain read data relative to multiple read thresholds. At step 532, the on-die circuitry signals that read data relative to multiple read thresholds are concurrently ready for output. The process is done at step 533.

FIG. 5H depicts another example read operation from a perspective of an off-die controller such as the external controller 109 of FIG. 1A, consistent with the read operation of FIG. 5G. At step 540, the off-die controller transmits a read command to on-die circuitry. At step 541, the off-die controller receives a signal that the read data relative to multiple read thresholds are concurrently ready for output, and retrieves the read data relative to the multiple read thresholds. At step 542, the off-die controller decodes the read data relative to the multiple read thresholds. At decision step 543, if the decoding is unsuccessful, step 540 may be repeated in which the off-die controller transmits a read command to on-die circuitry to obtain additional read data relative to one, or multiple, read thresholds. If the decoding is successful, the process is done at step 544.

Figures 6A, 6B:
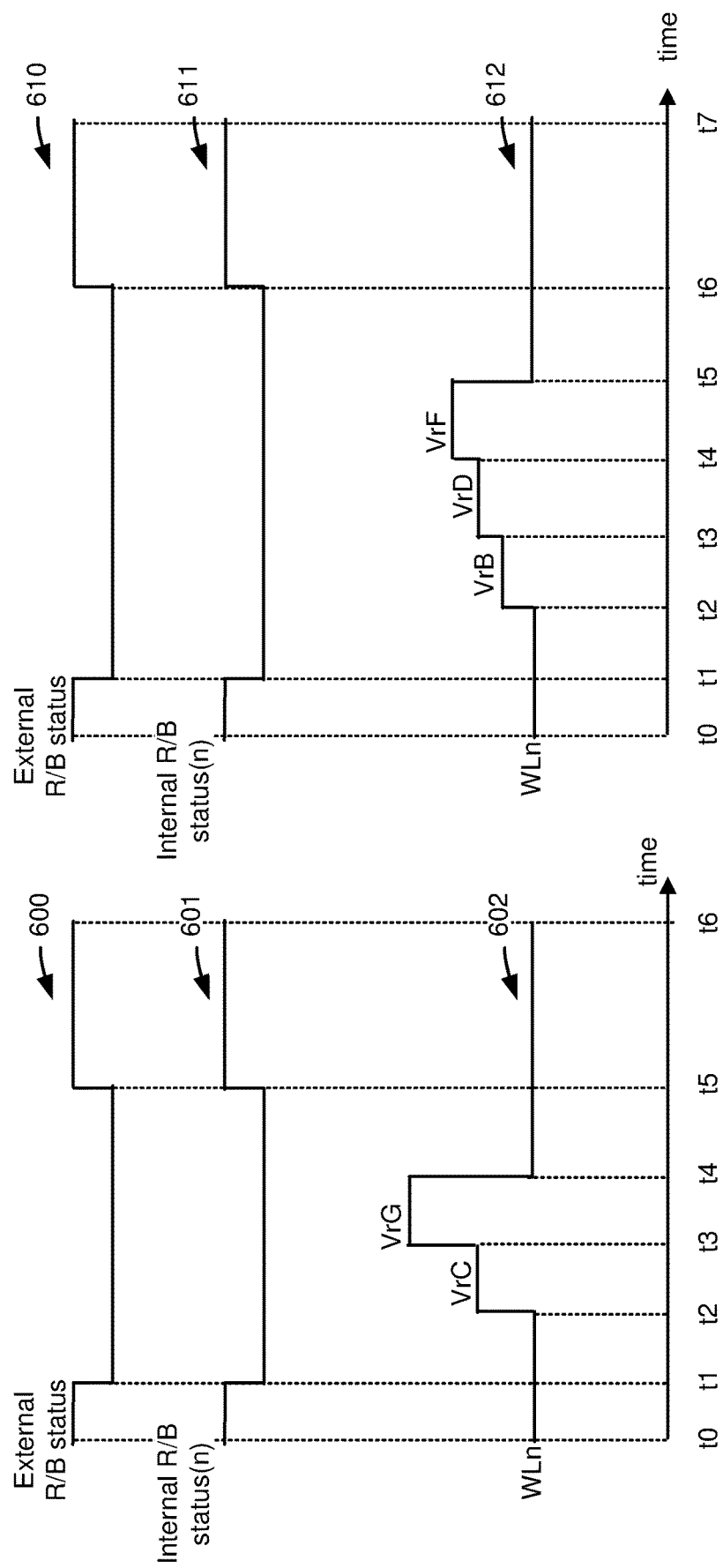
FIG. 6A depicts waveforms used in reading an upper page of data using two word line voltages, consistent with the processes of FIG. 5A to 5F.
FIG. 6B depicts waveforms used in reading a middle page of data using three word line voltages, consistent with the processes of FIG. 5A to 5F.

FIG. 6A depicts waveforms used in reading an upper page of data using two word line voltages, consistent with the processes of FIG. 5A to 5F. In FIG. 6A-6E, the horizontal axis indicates increasing time and the vertical axis depicts a voltage. The plots 600, 610, 620, 630 and 640 depict a ready/busy status of the on-die circuitry. This is a status seen by the external controller. When this status is ready, the external controller may be able to retrieve data from a set of output latches on the die. A high or low level of the plot represents a ready or busy status, respectively.

The plots 601, 611, 621, 631 and 641 depict an internal ready/busy status of the on-die circuitry. This status is busy when the on-die circuitry is performing actions such as instructing the row control circuitry to supply voltages to word lines, instructing the column control circuitry to perform sensing, and transferring read data to latches.

In FIG. 6A, a plot 602 depicts a voltage applied to a selected word line WLn in which the read type is an upper page read, consistent with FIG. 4C. The read voltages are VrC and VrG. 0 V may be applied at other times.

In FIG. 6A-6E, from t0-t1, commands may be issued by the external controller to begin a read operation. An example format of commands is: read type/address type/address/read type/address type/address/begin read. The read type can be, e.g., lower page, middle page, upper page, or single level cell (SLC) page. The address type can be three cycles which indicates the address includes three parts, e.g., plane, block and word line. From t0-t1, the external controller may also store values in the registers which indicate the read voltages. From t1-t2, the state machine reads the values in the registers and determines corresponding read voltages. The state machine instructs the row control circuitry to prepare to provide specified word line voltages and instructs the column control circuitry to prepare to perform sensing.

In FIG. 6A, from t2-t3, VrC is applied on WLn while sensing occurs for associated memory cells. The read data obtained is transferred from SDL latches into ADL latches.

From t3-t4, VrG is applied on WLn while sensing occurs for associated memory cells. The read data obtained is transferred from SDL latches into ADL latches.

From t4-t5, the read data obtained from sensing during t2-t3 and t3-t4 is transferred from the ADL latches to the XDL latches (the output latches). Once this is complete, at t5, the on-die circuitry determines that the read operation for the page is complete, and sets an external ready status. The external controller detects this status and issues a check status command. In response, the on-die circuitry provides a status message, e.g., as a byte of status data, indicating that the read data is ready to be streamed out (retrieved) from the output latches.

The external controller can issue a check status command at any time. For example, if such a command is issued before t5, the status message would indicate that no data is ready to be retrieved. Just after t5, in response to learning that the read data is ready to be retrieved, the external controller issues a command to retrieve the read data. An example format of such a command is: address type/stream out data. The address type can be five cycles which indicates the address includes five parts, e.g., plane, block, word line, column start and column end. The read data is then output to the external controller.

At t6, the external controller determines that it has completed its read out of data. The external controller then decodes the data and decides whether recovery read data is desired. If it is, the external controller may issue a command for recovery read data. In one approach, the recovery read data has already been obtained and is in the output latches, in which case the recovery read data can be immediately retrieved. In one approach, part of the recovery read data has been obtained, in which case the recovery read data can be retrieved soon. If the recovery read data has not already been obtained, or started to be obtained, a recovery read is started in response to the command. In one approach, a first pass through the plots of FIG. 6A is used to obtain baseline read data and a second pass is used to obtained recovery read data. This is shown further in FIG. 6E. It is also possible to obtain both baseline and recovery read data in one pass.

FIG. 6A can be modified to represent a lower page read using VrA and VrE in place of VrC and VrG, respectively.

FIG. 6B depicts waveforms used in reading a middle page of data using three control gate (word line) voltages, consistent with the processes of FIG. 5A to 5F. A plot 612 depicts a voltage applied to a selected word line WLn in which the read type is a middle page read, consistent with FIG. 4C. The read voltages are VrC and VrG. 0 V may be applied at other times.

From t2-t3, VrB is applied on WLn while sensing occurs for associated memory cells. The read data obtained is transferred from SDL latches into ADL latches.

From t3-t4, VrD is applied on WLn while sensing occurs for associated memory cells. The read data obtained is transferred from SDL latches into ADL latches.

From t4-t5, VrF is applied on WLn while sensing occurs for associated memory cells. The read data obtained is transferred from SDL latches into ADL latches.

From t5-t6, the read data obtained from sensing during t2-t3, t3-t4 and t4-t5 is transferred from the ADL latches to the XDL latches. Once this is complete, at t6, the on-die circuitry determines that the read operation for the page is complete, and sets an external ready status. The external controller detects this status and issues a check status command. In response, the on-die circuitry provides a status message indicating that the read data is ready to be streamed out. Just after t6, in response to learning that the read data is ready to be retrieved, the external controller issues a command to retrieve the read data.

At t7, the external controller determines that it has completed its read out of data. As before, the external controller decodes the data and decides whether recovery read data is desired. If it is, the external controller may issue a command for recovery read data. In one approach, a first pass through the plots of FIG. 6B is used to obtain baseline read data and a second pass is used to obtained recovery read data. It is also possible to obtain both baseline and recovery read data in one pass.

FIG. 6C depicts waveforms used in reading an upper page of data using four word line voltages, consistent with the processes of FIG. 5A to 5F. A plot 622 depicts a voltage applied to a selected word line WLn in which the read type is an upper page read, consistent with FIG. 4C. In contrast to FIG. 6A, an additional control gate voltage is applied to facilitate obtaining read recovery data.

From t2-t3, VrCd (the downshifted recovery read voltages associated with VrC) is applied on WLn while sensing occurs for associated memory cells. The read data obtained is transferred from SDL latches into ADL latches.

From t3-t4, VrCu (the upshifted recovery read voltages associated with VrC) is applied on WLn while sensing occurs for associated memory cells. The read data obtained is transferred from SDL latches into ADL latches.

From t4-t5, VrGd (the downshifted recovery read voltages associated with VrG) is applied on WLn while sensing occurs for associated memory cells. The read data obtained is transferred from SDL latches into ADL latches.

From t5-t6, VrGu (the upshifted recovery read voltages associated with VrG) is applied on WLn while sensing occurs for associated memory cells. The read data obtained is transferred from SDL latches into ADL latches.

From t6-t7, the read data obtained from sensing during t2-t3, t3-t4, t4-t5 and t5-t6 is transferred from the ADL latches to the XDL latches. Once this is complete, at t7, the on-die circuitry determines that the read operation for the page is complete, and sets an external ready status. The external controller detects this status and issues a check status command. In response, the on-die circuitry provides a status message indicating that the read data is ready to be streamed out. Just after t7, in response to learning that the read data is ready to be retrieved, the external controller issues a command to retrieve the read data.

At t8, the external controller determines that it has completed its read out of data. As before, the external controller decodes the data and decides whether recovery read data is desired. If it is, the external controller may issue a command for recovery read data.

In one approach, a first pass through the plots of FIG. 6A is used to obtain baseline read data and a second pass through the plots of FIG. 6C is used to obtained recovery read data.

FIG. 6D depicts waveforms used in reading data using one word line voltage, consistent with the processes of FIG. 5A to 5F. A plot 632 depicts a voltage applied to a selected word line WLn. In this example, a single control gate voltage is used. However, a pass through FIG. 6D can be repeated with a different control gate voltages. For example, an upper page read may be performed in which a first pass through FIG. 6D uses VrC and a second pass uses VrG. Sensing may occur at three read thresholds: the baseline read threshold, an upshifted recovery read threshold and a downshifted recovery read threshold, during each word line voltage. By breaking up the page read into two passes, it is possible to obtain as much read data in each pass as is allowed by the number of latches. In this example, three bits of read data per pass is allowed but not six bits.

From t2-t3, VrC is applied on WLn while sensing occurs for associated memory cells. The read data obtained from sensing during t2-t3 is transferred from SDL latches into ADL latches.

From t3-t4, the read data obtained from sensing during t2-t3 is transferred from the ADL latches to the XDL latches. Once this is complete, at t4, the on-die circuitry sets an external ready status. The external controller detects this status and issues a check status command. In response, the on-die circuitry provides a status message indicating that the read data is ready to be streamed out. Just after t4, in response to learning that the read data is ready to be retrieved, the external controller issues a command to retrieve the read data.

At t5, the external controller determines that it has completed its read out of data. The external controller decodes the data and decides whether additional recovery read data is desired. If it is, the external controller may issue a command for additional recovery read data.

Various example read processes can be performed which are consistent with the plots of FIG. 6A-6D. Refer also to the example sense circuit of FIG. 8C and the latches SDL and ADL, and to FIGS. 7A-7C and the latches XDL.

Example 1

Referring to FIG. 6A, obtain first read data (S1) from sensing relative to first read threshold during a first control gate voltage, followed by obtaining second read data (S2) from sensing relative to a second read threshold during a second control gate voltage:

| | |
|---|---|
| t2-t3 | sense to obtain S1 and store S1 in SDL transfer SDL→ADL1 |
| t3-t4 | sense to obtain S2 and store S2 in SDL transfer SDL→ADL2 |
| t4-t5 | transfer ADL1→XDL1 and ADL2→XDL2 |
| t5-t6 | transfer XDL1→CTL and XDL2→CTL |

CTL refers to the external controllers and the arrows (→) represent data transfers.

In one example, the first read threshold and the first control gate voltage are both VrC, and the second read threshold and the second control gate voltage are both VrG.

This is an example of first and second baseline read data. Generally, the read threshold can be the same as or different than the control gate voltage. The read threshold is the Vth to which the Vth of the memory is compared. Parameters such as sense node decay time and reference voltage level can be varied to make the read threshold the same as or different than the control gate voltage. Typically, in a baseline read, the read threshold is same as the control gate voltage, but this is not required. Moreover, when a baseline read and a shifted read are performed, one approach is to obtain both the baseline read data and the shifted read data during one control gate voltage, while using different sense circuit parameters.

Example 2

Referring to FIG. 6B, this example performs one sensing operation for each of three control gate voltages. This can include obtaining first, second and third read data (S1, S2 and S3, respectively) by sensing relative to first, second and third read thresholds of VrB, VrD and VrF during the application of control gate voltages of VrB, VrD and VrF, respectively, for instance.

| t2-t3 | sense to obtain S1 and store S1 in SDL |
| | transfer SDL→ADL1 |
| t3-t4 | sense to obtain S2 and store S2 in SDL |
| | transfer SDL→ADL2 |
| t4-t5 | sense to obtain S3 and store S3 in SDL |
| | transfer SDL→ADL3 |
| t5-t6 | transfer ADL1→XDL1, ADL2→XDL2 and ADL3→XDL3. |
| t6-t7 | transfer XDL1→CTL, XDL2→CTL and XDL3→CTL. |

Example 3

Referring to FIG. 6A, obtain first and second read data (S1 and S2, respectively) from sensing relative to first and second read thresholds, respectively, during a first control gate voltage, followed by obtaining third and fourth read data (S3 and S4, respectively) from sensing relative to third and fourth read thresholds, respectively, during a second control gate voltage:

| t2-t3 | sense to obtain S1 and store S1 in SDL1 |
| | sense to obtain S2 and store S2 in SDL2 |
| | transfer SDL1→ADL1 and SDL2→ADL2 |
| t3-t4 | sense to obtain S3 and store S3 in SDL1 |
| | sense to obtain S4 and store S4 in SDL2 |
| | transfer SDL1→ADL3 and SDL2→ADL4 |
| t4-t5 | transfer ADL1→XDL1, ADL2→XDL2, ADL3→XDL3 and ADL4→XDL4. |
| t5-t6 | transfer XDL1→CTL, XDL2→CTL, XDL3→CTL and XDL4→CTL. |

In one example, the first and second read thresholds are downshifted and upshifted read thresholds, respectively, of VrC (e.g., VrCd and VrCu, respectively), and the third and fourth read thresholds are downshifted and upshifted read thresholds, respectively, of VrG (e.g., VrGd and VrGu, respectively).

Example 4

Referring to FIG. 6B, this example performs two sensing operations in each of three control gate voltages instead of in each of two control gate voltages as in Example 3. This approach uses six latches ADL1-ALD6 in the sense circuit.

This can include obtaining first and second read data (S1 and S2, respectively) by sensing relative to first and second read thresholds of VrBd and VrBu, respectively, during the application of the first control gate voltage VrB, for instance. The process then includes obtaining third and fourth read data (S3 and S4, respectively) by sensing relative to third and fourth read thresholds of VrDd and VrDu, respectively, during the application of the second control gate voltage VrD, for instance. The process then includes obtaining fifth and sixth read data (S5 and S5, respectively) by sensing relative to fifth and sixth read thresholds of VrFd and VrFu, respectively, during the application of the third control gate voltage VrF, for instance.

| t2-t3 | sense to obtain S1 and store S1 in SDL1 |
| | sense to obtain S2 and store S2 in SDL2 |
| | transfer SDL1→ADL1 and SDL2→ADL2 |
| t3-t4 | sense to obtain S3 and store S3 in SDL1 |
| | sense to obtain S4 and store S4 in SDL2 |
| | transfer SDL1→ADL3 and SDL2→ADL3 |
| t4-t5 | sense to obtain S5 and store S5 in SDL1 |
| | sense to obtain S6 and store S6 in SDL2 |
| | transfer SDL1→ADL5 and SDL2→ADL6 |
| t5-t6 | transfer ADL1→XDL1, ADL2→XDL2, ADL3→XDL3, ADL4→XDL4, ADL5→XDL5 and ADL6→XDL6. |
| t6-t7 | transfer XDL1→CTL, XDL2→CTL, XDL3→CTL, XDL4→CTL, XDL5→CTL, XDL6→CTL. |

Example 5

Referring to FIG. 6A, obtain first and second read data (S1 and S2, respectively) from sensing relative to first and second read thresholds, respectively, during a first control gate voltage, followed by obtaining third read data (S3) from sensing relative to a third read threshold during a second control gate voltage. Thus, sensing occurs relative to two read thresholds during the application of one control gate voltage and relative to one read threshold during the application of another control gate voltage.

| t2-t3 | sense to obtain S1 and store S1 in SDL1 |
| | sense to obtain S2 and store S2 in SDL2 |
| | transfer SDL1→ADL1 and SDL2→ADL2 |
| t3-t4 | sense to obtain S3 and store S3 in SDL1 |
| | transfer SDL1→ADL3 |
| t4-t5 | transfer ADL1→XDL1, ADL2→XDL2 and ADL3→XDL3 |
| t5-t6 | transfer XDL1→CTL, XDL2→CTL and XDL3→CTL. |

This generally involves sensing relative to one number N1 of read thresholds during one control gate voltage and sensing relative to another number N2 of read thresholds during another control gate voltage, where N1 does not equal N2 and N1 and N2 are integers of one or more. This approach recognizes that sensing relative to multiple read thresholds may be more desirable at certain times but not at all times. For example, if it is known that read errors occur more often when distinguishing B and C state memory cells from one another than when distinguishing F and G state memory cells from one another, the sensing relative to multiple read thresholds is more desirable when distinguishing B and C state memory cells from one another than when distinguishing F and G state memory cells from one another.

For example, in FIG. 6A, sensing relative to VrCd and VrCu can occur while VrC is the control gate voltage, and sensing relative to VrGd or VrGu can occur while VrG (or VrGd or VrGu) is the control gate voltage. A downshifted or upshifted read threshold can be used based on experience which indicates which of the two is likely to be more useful in the decoding process. When data retention loss is prominent, the downshifted read threshold may be more useful than the upshifted read threshold, for instance.

Example 6

Referring to FIG. 6C, obtain first-fourth read data (S1-S4, respectively) from sensing relative to first-fourth read thresholds, respectively, during first-fourth control gate voltages, respectively:

| | |
|---|---|
| t2-t3 | sense to obtain S1 and store S1 in SDL1 |
| | transfer SDL1→ADL1 |
| t3-t4 | sense to obtain S2 and store S2 in SDL2 |
| | transfer SDL2→ADL2 |
| t4-t5 | sense to obtain S3 and store S3 in SDL3 |
| | transfer SDL3→ADL3 |
| t5-t6 | sense to obtain S4 and store S4 in SDL1 |
| | transfer SDL4→ADL4 |
| t6-t7 | transfer ADL1→XDL1, ADL2→XDL2, ADL3→XDL3 and ADL4→XDL4. |
| t7-t8 | transfer XDL1→CTL, XDL2→CTL, XDL3→CTL and XDL4→CTL. |

In one example, the first and second read thresholds are downshifted and upshifted read thresholds, respectively, of VrC (e.g., VrCd and VrCu, respectively), and the third and fourth read thresholds are downshifted and upshifted read thresholds, respectively, of VrG (e.g., VrGd and VrGu, respectively), consistent with FIG. 6C.

Example 7

Referring to FIG. 6D, for instance, this example involves obtaining first-third read data (S1-S3, respectively) from sensing relative to first-third read thresholds, respectively, during a first control gate voltage. This example works when three SDL latches are available in a sense circuit. Generally, the number of latches is limited in the memory device and it is costly to add new latches, so it is desirable to work with a minimal number of latches. In one approach, the first, second and third read thresholds are a baseline read threshold and downshifted and upshifted recovery read thresholds, respectively. For instance, this could be the baseline read threshold of VrC and the downshifted and upshifted recovery read thresholds, VrCd and VrCu, respectively.

| | |
|---|---|
| t2-t3 | sense to obtain S1 and store S1 in SDL1 |
| | sense to obtain S2 and store S2 in SDL2 |
| | sense to obtain S3 and store S3 in SDL3 |
| | transfer SDL1→ADL1, SDL2→ADL2 and SDL3→ADL3 |
| t3-t4 | transfer ADL1→XDL1, ADL2→XDL2 and ADL3→XDL3. |
| t4-t5 | transfer XDL1→CTL, XDL2→CTL and XDL3→CTL. |

Example 8

Referring to FIG. 6A, this example extends the three sensing operations from Example 7 to two control gate voltages instead of one. This approach assumes six latches ADL1-ALD6 are available in the sense circuit. This can include obtaining first-third read data (S1-S3, respectively) by sensing relative to first-third read thresholds of VrC, VrCd and VrCu, respectively, during the application of the first control gate voltage VrC, for instance. The process then includes obtaining fourth-sixth read data (S4-S6, respectively) by sensing relative to fourth-sixth read thresholds of VrG, VrGd and VrGu, respectively, during the application of the second control gate voltage VrG, for instance.

| | |
|---|---|
| t2-t3 | sense to obtain S1 and store S1 in SDL1 |
| | sense to obtain S2 and store S2 in SDL2 |
| | sense to obtain S3 and store S3 in SDL3 |
| | transfer SDL1→ADL1, SDL2→ADL2 and SDL3→ADL3 |
| t3-t4 | sense to obtain S4 and store S4 in SDL1 |
| | sense to obtain S5 and store S5 in SDL2 |
| | sense to obtain S6 and store S6 in SDL3 |
| | transfer SDL1→ADL4, SDL2→ADL5 and SDL2→ADL6 |
| t4-t5 | transfer ADL1→XDL1, ADL2→XDL2, ADL3→XDL3, ADL4→XDL4, ADL5→XDL5 and ADL6→XDL6. |
| t5-t6 | transfer XDL1→CTL, XDL2→CTL, XDL3→CTL, XDL4→CTL, XDL5→CTL and XDL6→CTL. |

FIG. 6E depicts waveforms used in performing a baseline read followed by a recovery read using two series of the waveforms of FIG. 6A. The plot 642 depicts a voltage applied to WLn. In this example, a baseline read command is issued by an external controller at t0. A baseline read is performed from t0-t5 including sensing from t2-t4, as discussed previously, e.g., in Example 1. The external controller retrieves the baseline read data from t5-t6 and decodes it from t6-t9, for instance. After the decoding, the external controller issues a recovery read command at t9. However, the recovery read has already started at t6 without waiting for the recovery read command. A recovery read is performed from t6-t10 including sensing from t7-t9, as discussed previously, e.g., in Example 3.

The external controller can retrieve the recovery read data from t10-t11. Time savings are achieved in providing the recovery read data to the external controller. Specifically, the external controller begins to retrieve the recovery read data after a delay of only t10-t9 relative to the issuance of the recovery read command. This is compared to the longer delay of t10-t6 which would result if the recovery read did not start until the external controller issued the recovery read command at t6.

If the external controller completed the decoding after the recovery read data was obtained and transferred to the output latches, e.g., after t10, the external controller could begin to retrieve the recovery read data immediately.

FIG. 7A depicts groups of sense controllers which transfer first and second read data to sets of output latches XDL1 and XDL2, respectively. This process obtains read data in two latches, ADL1 and ADL2, for each memory cell which is read. In one approach, one sense circuit is connected to each bit line and one sense circuit controller is associated with a number of sense circuits such as sixteen sense circuits. Each sense circuit controller has the ability to transfer read data from internal latches associated with each sense circuit to a set of output latches which are accessible to an external controller. See also FIG. 8C. The internal latches are typically not accessible to an external controller.

Each group of sense circuit controllers can include sixteen sense circuit controllers, for instance, so that read data from 256 sense circuits or memory cells is output by each group of sense circuit controllers. Further, in this example, there are eight groups of sense circuit controllers 700-707, representing 2,048 sense circuits or memory cells. The group 700 includes example sense circuit controllers 700a, 700b, 700c . . . . This arrangement facilities the incremental transfer of read data to the output (XDL) latches over an internal bus 810 having a limited size. The internal bus 810 may be part of the input/output circuitry 106 of FIG. 1A.

The output latches can be arranged in a similar way as the sense circuit controllers. For example, there are eight groups of 16×16 XDL latches 710-777, representing 2,048 XDL latches. Each group of sense circuit controllers has the ability to transfer data to one or more groups of output latches. In this example, consistent with Example 1, discussed previously, first read data from the groups of sense circuit controllers 700-703 is stored in groups of latches 710-713, respectively, collectively referred to as output latches XDL1, and second read data from the groups of sense circuit controllers 700-703 is stored in groups of latches 714-717, respectively, collectively referred to as output latches XDL2. This example involves reading half of the memory cells connected to a selected word line, for example, using half of the groups of sense circuit controllers.

Generally, a read operation can involve a portion of the memory cells connected to a selected word line. The number of memory cells which can be read at a time is limited by the amount of read data which is transferred to the output latches. For example, with two bits of read data per memory cell, one half of the memory cells can be read as in FIG. 7A. With four bits of read data per memory cell, one fourth of the memory cells can be read as in FIG. 7B. With three bits of read data per memory cell, one third of the memory cells can be read, in theory. Although, a limitation may be imposed in which all or none of the memory cells of a group of sense circuit controllers have to be read in a given read operation. In this case, three-fourths of the memory cells can be read as in FIG. 7C.

In one embodiment, a set of memory cells is read in response to a read command from an off-die controller, the set of memory cells comprises no more than half of a number of memory cells connected to a word line, and a number of latches in the set of output latches is at least equal to the number of memory cells.

The read data in the output latches can be transferred to the external controller 109 via an output bus. The data is transferred incrementally due to a limited size of the output bus. See, e.g., FIG. 8B.

FIG. 7B depicts groups of sense controllers which transfer first-fourth read data to first-fourth sets of output latches XDL1-XDL4, respectively. In this example, consistent with Examples 3, 4 and 6, discussed previously, first read data from the groups of sense circuit controllers 700 and 701 is stored in groups of latches 710 and 711, respectively, collectively referred to as output latches XDL1, second read data from the groups of sense circuit controllers 700 and 701 is stored in groups of latches 712 and 713, respectively, collectively referred to as output latches XDL2, third read data from the groups of sense circuit controllers 700 and 701 is stored in groups of latches 714 and 715, respectively, collectively referred to as output latches XDL3, and fourth read data from the groups of sense circuit controllers 700 and 701 is stored in groups of latches 716 and 717, respectively, collectively referred to as output latches XDL4. This example involves reading one fourth of the memory cells connected to a selected word line in a read operation. Subsequent read operations can involve the other sense circuit controllers and memory cells so that the entire word line can be read in four read operations.

FIG. 7C depicts groups of sense controllers which transfer first-third read data to first-third sets of output latches XDL1-XDL3, respectively. In this example, consistent with Examples 2, 5 and 7, discussed previously, first read data from the groups of sense circuit controllers 700 and 701 is stored in groups of latches 710 and 711, respectively, collectively referred to as output latches XDL1, second read data from the groups of sense circuit controllers 700 and 701 is stored in groups of latches 712 and 713, respectively, collectively referred to as output latches XDL2, and third read data from the groups of sense circuit controllers 700 and 701 is stored in groups of latches 714 and 715, respectively, collectively referred to as output latches XDL3. This example involves reading one fourth of the memory cells connected to a selected word line in a read operation.

Figure 8A:
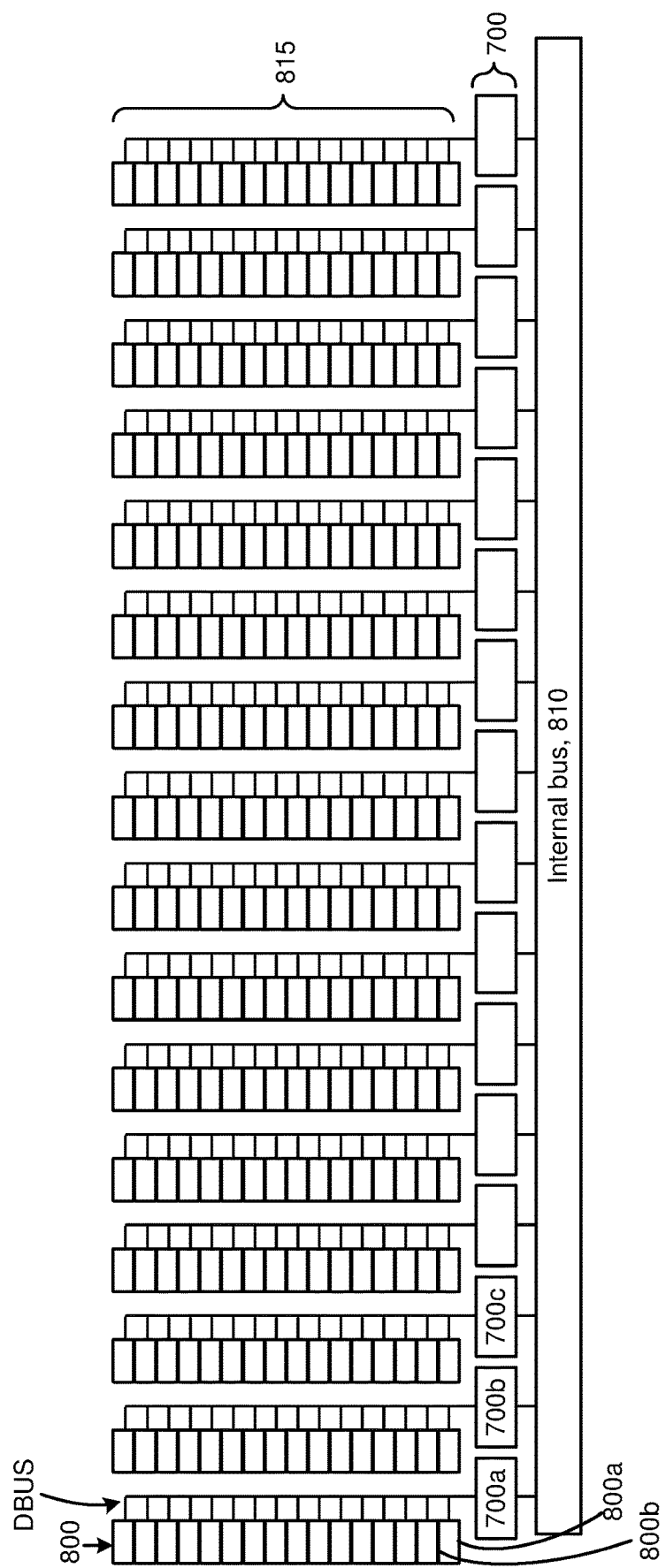
FIG. 8A depicts an example configuration of the group 700 of sense controllers of FIG. 7A to 7C and the associated sense circuits.

FIG. 8A depicts an example configuration of the group 700 of sense controllers of FIG. 7A to 7C and the associated sense circuits. A set of sense circuits 815 and the set of sense circuit controllers 700 is depicted. As mentioned, each sense circuit controller 700a, 700b, 700c . . . is associated with a set of sense circuits 800 such as sixteen sense circuits, including example sense circuits 800a and 800b. Each sense circuit in turn is connected to a respective bit line and to a memory cell of a selected word line. A data bus DBUS allows data to be communicated between the sixteen sense circuits and the associated sense circuit controller. The sense circuit controllers in turn are connected to the internal bus 810 to transmit read data to the output latches. In one approach, a sense circuit controller can transmit one bit of read data at a time from a selected sense circuit to the output latches, and the different sense circuit controllers can transmit bits in parallel to the output latches. To transfer read data from the sense circuits to the output latches, a sense circuit controller selects each sense circuit in turn and transfers its read data to an XDL latch.

The unit of 256 sense circuits and the sixteen sense circuit controllers is repeated eight times to provide the configuration of FIG. 7A-7C.

Figure 8B:
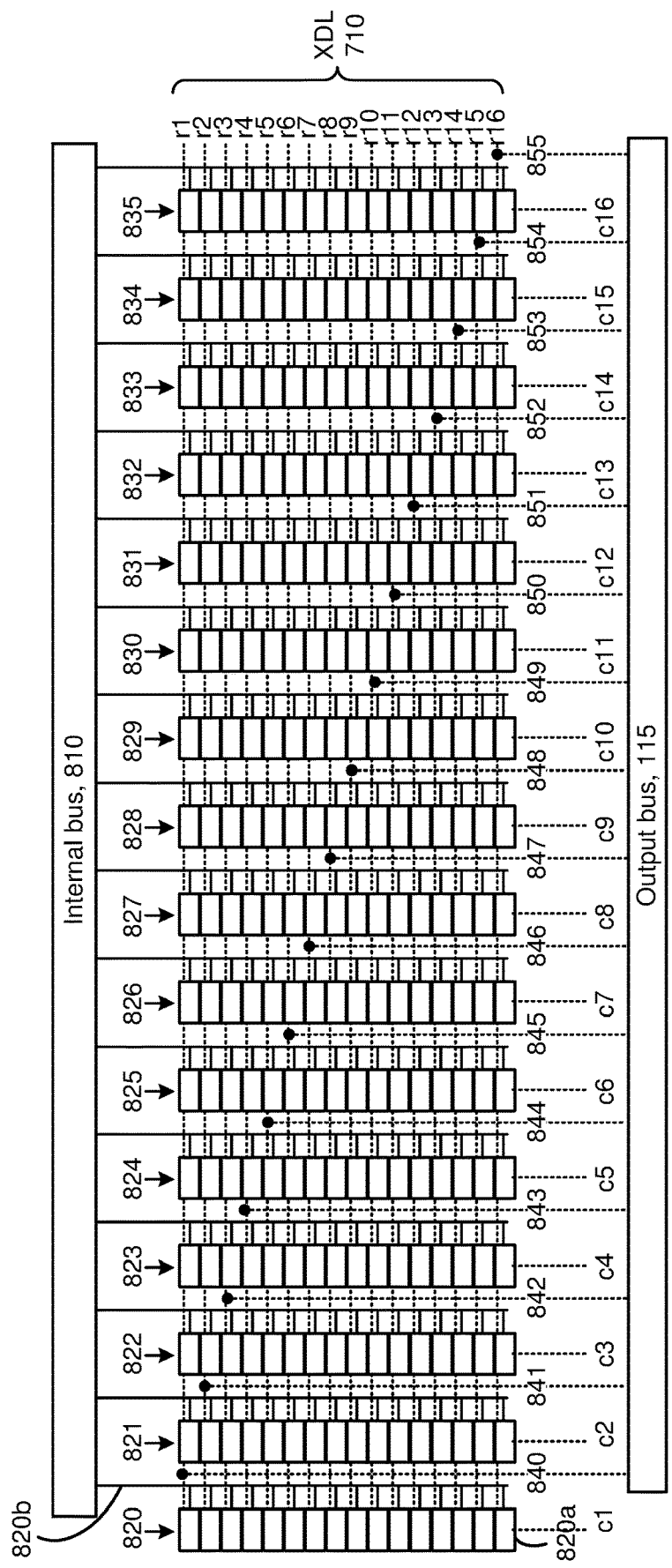
FIG. 8B depicts an example configuration of the group 710 of 16×16 XDL latches of FIG. 7A to 7C.

FIG. 8B depicts an example configuration of the group 710 of 16×16 XDL latches of FIG. 7A to 7C. The output latches are arranged in sixteen sets 820-835 of sixteen latches, in the group 710 of 256 output latches. A path extends from the internal bus 810 to each set of sixteen latches. For example, a path 820b extends from the internal bus to the set of sixteen latches 820. This set includes an example output latch 820a. Further, access lines r1-r16 are connected to rows of output latches, one output latch per set, and paths 840-855 connect the output bus 115 to the access lines r1-r16, respectively. Control signals c1-c16 select one of the sets of output latches at a time to allow the 16 bits (e.g., one data word of two bytes) of the selected set to be output in parallel to the output bus.

Figure 8C:
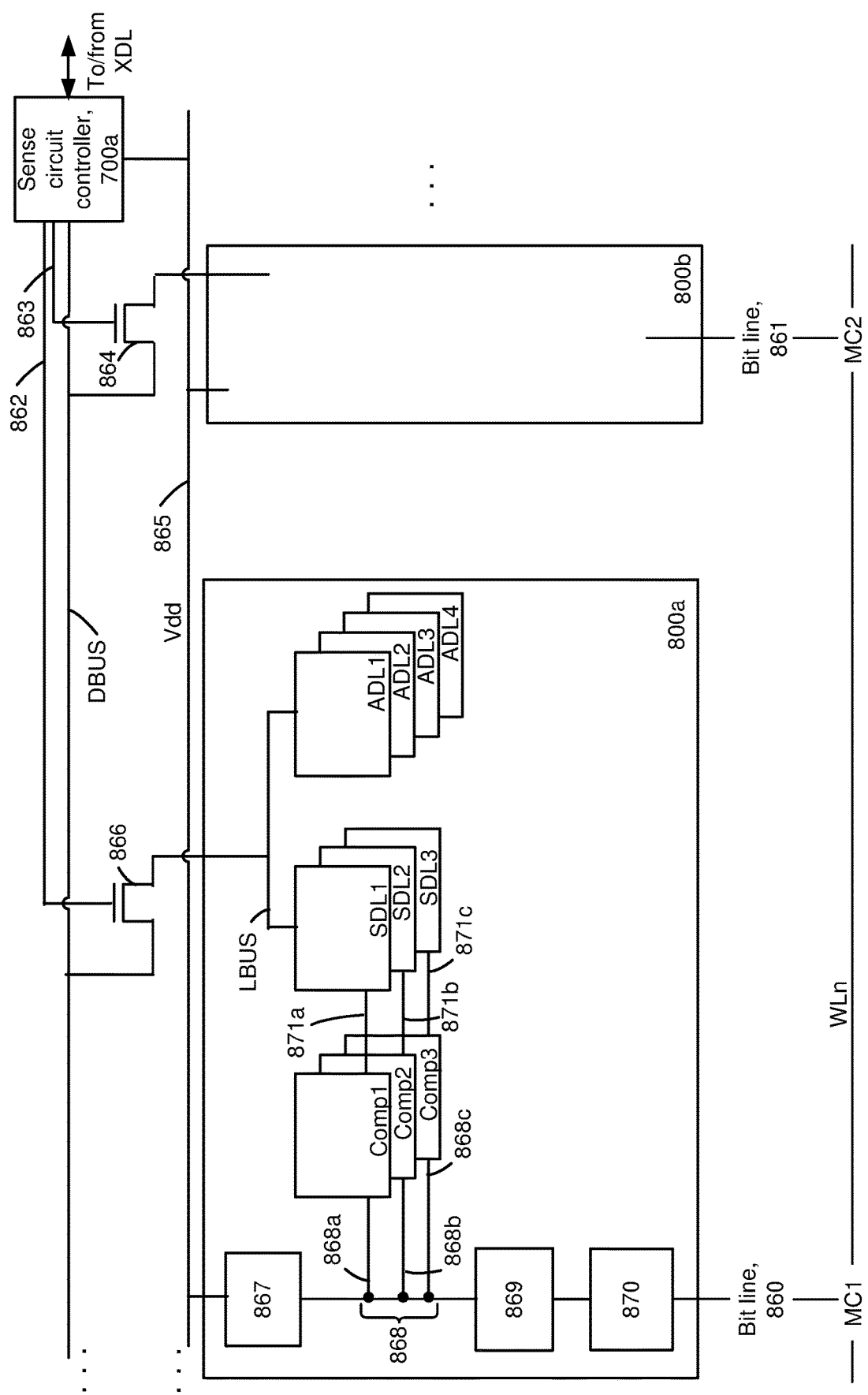

FIG. 8C depicts an example block diagram of the sense circuits 800a and 800b of FIG. 8A and the associated sense circuit controller 700a. The sense circuits and sense circuit controllers can be part of the column control circuitry 104 of FIG. 1A. As mentioned, the sense circuit controller 700a can communicate with a set, e.g., sixteen, of sense circuits, including the sense circuits 800a and 800b via a data bus DBUS. The sense circuit controller can also send data to/from the XDL latches. Each sense circuit has a similar configuration. The configuration of the sense circuit 800a is provided in detail. The sense circuit controller can select one sense circuit at a time to communicate with. For example, sense circuits 800a and 800b can be selected via transistors 866 and 864, respectively, via voltages on paths 862 and 863, respectively. The transistors connect DBUS to a local bus LBUS within each sense circuit. A voltage such as Vdd can be provided to each sense circuit via a path 865.

The sense circuit 800a of FIG. 8A includes one or more comparators. In this example, three comparators, Comp1, Comp2 and Comp3, are provided. In general, one or more may be provided. Each comparator is connected to a sense node 868 and senses the Vth of a memory cell MC1 cell via a bit line 860, relative to a respective read threshold. Comp1, Comp2 and Comp3 are connected to the sense node 868 via paths 868a, 868b and 868c, respectively, and to trip latches SDL1, SDL2, SDL3, respectively, via paths 871a, 871b and 871c, respectively.

During sensing, a control gate voltage is applied to the selected word line WLn. Typically, the control gate voltage is fixed while sensing occurs, although it can vary during sensing in other embodiments such as ramp sensing. A voltage clamp 867 such as a transistor sets a pre-charge voltage at the sense node. A sense node-to-bit line (BL) switch 869 selectively connects the sense node to the bit line 860. A voltage clamp 870 can set a voltage on the bit line. When the sense node is connected to the bit line, the comparators can evaluate a current or voltage on the bit line and compare it to a reference level. Each comparator sets a bit in a trip latch SDL1-SDL3, where the bit indicates whether the current or voltage is above or below a respective reference level. See FIG. 9A, for example. The bits of read data in SDL1-SDL3 can be transferred to the latches ADL1-ADL4 via LBUS. Various examples were discussed above in which read data is transferred from the SDL latches to the ADL latches. For example, in one approach, two of the SDL latches, SDL1 and SDL2, may be used to obtain first and second read data during a first control gate voltage on WLn. The first and second read data is then transferred to ADL1 and ADL2, respectively. Subsequently, SDL1 and SDL2, may be used to obtain third and fourth read data during a second control gate voltage on WLn. The third and fourth read data is then transferred to ADL3 and ADL4, respectively.

The sense circuit 800b of FIG. 8A can have a similar configuration as the sense circuit 800a. The sense circuit 800b is connected to a memory cell MC2 via a bit line 861. The example memory cells MC1 and MC2 are connected to WLn.

The ADL latches may be a first set of latches and the XDL latches may be a second set of latches accessible to an off-die controller.

Figure 9A:
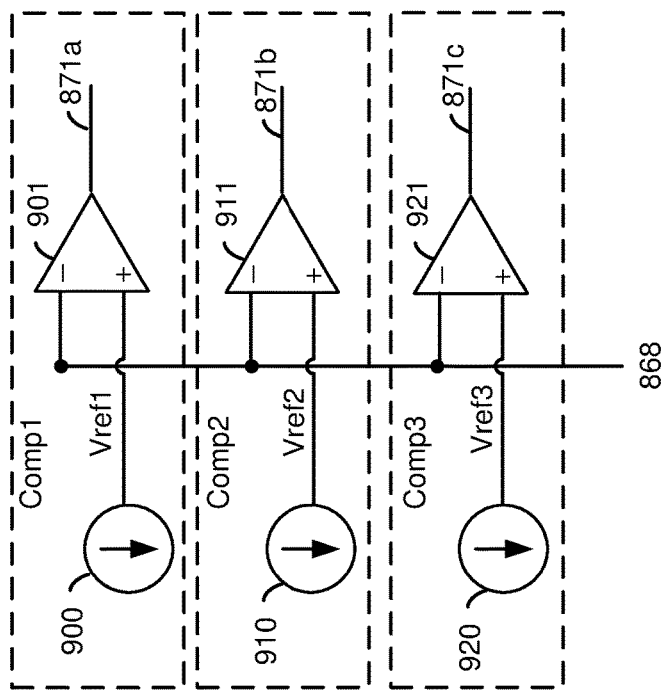
FIG. 9A depicts an example block diagram of the comparators Comp1-Comp3 in the sense circuit 800a of FIG. 8C.

FIG. 9A depicts an example block diagram of the comparators Comp1-Comp3 in the sense circuit 800a of FIG. 8C. Each comparator Comp1, Comp2 and Comp3 includes a current source 900, 910 and 920, respectively, which provides a different reference voltage Vref1, Vref2 and Vref3 (or read threshold), respectively, to a positive input of a respective amplifier 901, 911 and 921, respectively. The negative input of each amplifier is connected to the sense node 868. The associated memory cell can therefore be sensed relative to up to three different read thresholds concurrently. An output of each amplifier comprises a bit indicating whether the Vth of the memory cell is above or below the associated read threshold. The outputs of the comparators are transferred to the trip latches SDL1, SDL2, SDL3, respectively, via paths 871a, 871b and 871c, respectively, as mentioned.

In one example, consistent with Examples 2, 5 and 7, discussed previously, Vref1, Vref2 and Vref3 represent first, second and third read thresholds, respectively.

Figure 9B:
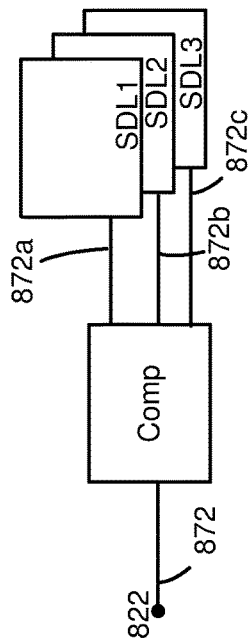
FIG. 9B depicts an example block diagram of a configuration in which one comparator Comp obtains read data for three latches SDL1-SDL3 in the sense circuit 800a of FIG. 8C using the time-based approach of FIG. 9C.
Figure 9C:
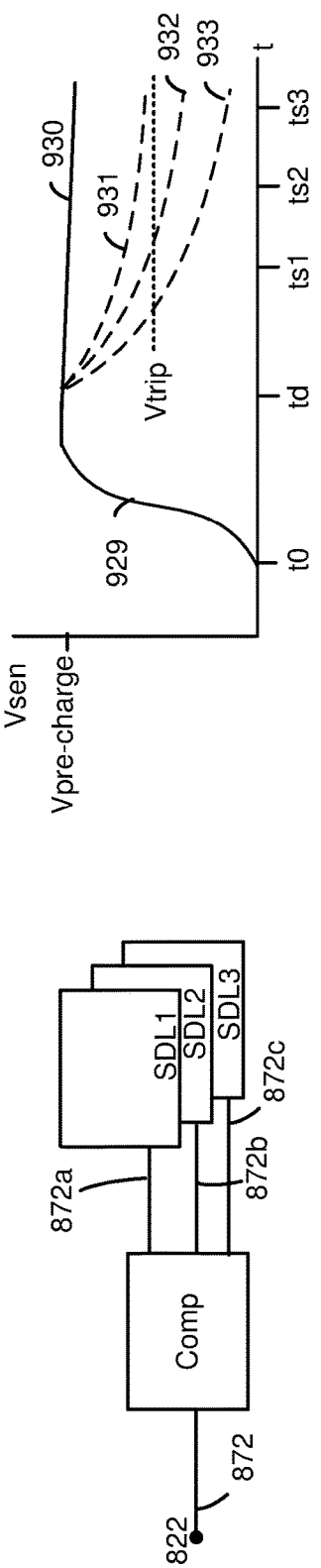
FIG. 9C depicts a plot of the discharging of the voltage of the sense node 868 in the sense circuit 800a of FIG. 8C at a time td and sensing at times ts1, ts2 and ts3.

FIG. 9B depicts an example block diagram of a configuration in which one comparator Comp obtains read data for three latches SDL1-SDL3 in the sense circuit 800a of FIG. 8C using the time-based approach of FIG. 9C. This approach reduces the number of comparators to save space although sensing time may be slightly increased. The comparator Comp is connected at an input side to the sense node via a path 872, and at an output side to the latches SDL1, SDL2 and SDL3 via paths 872a, 872b and 872c, respectively. As depicted in FIG. 9C, a voltage of the sense node Vsen is set at a pre-charge level, Vpre-charge, and subsequently allowed to decay according to the current passing through the selected memory cell being sensed and the corresponding voltage of the sense node. At a different sense time for each read threshold, a determination is made as to whether the voltage has decayed below a trip voltage, Vtrip. A corresponding bit of read data is set for each sense time and sent to a respective one of the SDL latches.

FIG. 9C depicts a plot of the discharging of the voltage of the sense node 868 in the sense circuit 800a of FIG. 8C at a time td, and sensing at times ts1, ts2 and ts3. As mentioned, in the sense circuit, a sense node is charged and allowed to communicate with a bit line. The amount of discharge of the sense node is sensed relative to one or more trip voltages at different sense times, and corresponding data is stored in the trip latches of the sense circuit. The vertical axis depicts Vsen, a sense node voltage, and the horizontal axis depicts time.

A plot 929 depicts the increase of Vsen to Vpre-charge due to the pre-charging process which begins at t0. At a discharge time, td, the sense node is allowed to discharge through the bit line and the NAND strings. The time periods of ts1-td, ts2-td and ts3-td are sense periods or integration times. The amount of discharge is limited by the conductivity of the memory cell being read. If the memory cell is in a non-conductive state (plot 930), Vsen does not fall below the trip voltage, Vtrip, at the sense times. Plots 931-933 depict different possible cases where the memory cell is in a conductive state with different degrees of conductivity.

In one example, consistent with Examples 2, 5 and 7, discussed previously, the read data obtained at ts1, ts2 and ts3 represents a comparison of the Vth of the memory cell to first, second and third read thresholds, respectively. The sense times can be adjusted to adjust the read threshold. Reducing the sense time is analogous to reducing the read threshold and reducing the control gate voltage because it makes it harder for the memory cell to be in a conductive state.

FIG. 10 depicts an example LDPC decoding process as an example of the decoding process in FIG. 5B, step 512, and FIG. 5H, step 542. Step 1000 includes obtaining read data which can include read data relative to one or more read thresholds. Step 1001 includes assigning code words to the read data, such as depicted in FIG. 11A. Step 1002 includes assigning initial probability metrics to each bit in the code words, such as depicted in FIGS. 11B and 11C. Step 1003 includes performing iterative decoding using initial probability metrics such as LLRs, and adjusting the probability metrics in subsequent iterations. A decision step 1004 determines if the decoding converges, e.g., within a specified amount of time or number of iterations. If the decoding does converge, step 1005 includes storing the decoded code words as a final read result. If the decoding does not converge, step 1006 includes declaring an error or obtaining additional read data.

FIG. 11A depicts a table which provides multi-bit code words for different data states, consistent with FIG. 10, step 1001. For example, with eight states Er-G, a three bit code word can be used. Each code word has first, second and third bits in this example. In the LDPC decoding process, which may be performed by the ECC engine 109d or decoder of FIG. 1A, a logarithmic likelihood ratio (LLR) is associated with each bit as indicated in FIG. 11B. The LLRs are used in an iterative probabilistic decoding process, and indicate a reliability of each bit, that is, how likely it is that the bit is not errored. The LLR for a bit is given by $$Q = \log_2 \frac{P(v=0|Y)}{P(v=1|Y)},$$

where P(v=0|Y) is the probability that a bit is a 0 given the condition that the read state is Y, and P(v=1|Y) is the probability that a bit is a 1 given the condition that the read state is Y. Thus, an LLR>0 indicates a bit is more likely a 0 than a 1, while an LLR<0 indicates a bit is more likely a 1 than a 0, based on one or more parity checks of the error correction code. Further, a greater magnitude indicates a greater probability or reliability. Thus, a bit with an LLR=20 is more likely to be a 0 than a bit with an LLR=10, and a bit with an LLR=−20 is more likely to be a 1 than a bit with an LLR=−10. LLR=0 indicates the bit is equally likely to be a 0 or a 1.

During a decoding process, initial values of the LLRs are adjusted based on sensing relative to one or more read thresholds. The LLR for a bit can be increased in magnitude when the bit value is consistent in different code words from different read results. As more information is obtained from the additional read results, the decoding process can be improved, e.g., so that it converges more quickly or converges in cases in which it would otherwise not converge if only one read operation was made. In another approach, after a first read operation, additional read operations are not performed unless the decoding process does not successfully converge, e.g., within a given amount of time or number of iterations.

The decoder performs successive iterations in which it determines if parity checks of the error encoding process have been satisfied. If all parity checks are satisfied initially, the decoding process has converged and the code word is not errored. If one or more parity checks have not been satisfied, the decoder adjusts the LLRs of one or more of the bits which are inconsistent with a parity check and then reapplies the parity check to determine if it has been satisfied. For example, the magnitude and/or polarity of the LLRs can be adjusted. If the parity check in question is still not satisfied, the LLR can be adjusted again in another iteration. Adjusting the LLRs can result in flipping a bit (e.g., from 0 to 1 or from 1 to 0) in some, but not all, cases. Once the parity check in question has been satisfied, the next parity check, if applicable, is applied to the code word. The process continues in an attempt to satisfy all parity checks.

In some cases, when the iteration process of the ECC decoder takes too long to reach convergence, another read operation can be triggered. The decoding can continue or can be paused while the additional read is performed.

FIG. 11B depicts a table of initial values of LLRs for each bit of the code words of FIG. 11A based on first read data from sensing relative to a first read threshold, as one example implementation of FIG. 10, step 1002. The LLRs are denoted by values M1, M2 and M3, where M1<M2<M3. As mentioned previously, a positive LLR indicates a 0 bit, a negative LLR indicates a 1 bit, and a greater magnitude indicates a greater reliability or probability of correctness. For example, for the first bit in the Er state, LLR=−M3, indicating this bit has a high probability of being a 1. This can be seen intuitively, since the memory cell would have to be at least three states higher than the Er state in order for the first bit to not be a 1. For the first bit in the A state, LLR=−M2, indicating this bit has a moderate probability of being a 1. For the first bit in the B state, LLR=−M1, indicating this bit has a low probability of being a 1, because it is only one state away from being a 0. Similar reasoning applies to the other bit positions.

FIG. 11C depicts a table of initial values of LLRs for each bit of the code words of FIG. 11A based on first and second read data from sensing relative to first and second read thresholds, respectively, as another example implementation of FIG. 10, step 1002. In this case, two read results are obtained by the decoder at the start of the decoding process. This can be the read data relative to two read thresholds as mentioned in connection with FIGS. 5G and 5H, for example. After reading the table, an initial LLR for each bit is provided to the decoding process. Note that the tables can have three or more dimensions if three or more read operations are used.

FIG. 12A depicts an example sparse parity check matrix in an LDPC decoding process, in an example implementation of FIG. 10, step 1003. The memory cells store data which represents information bits and parity bits, where the parity bits are provided according to a coding process. Such a process involves adding parity bits to information bits. LDPC codes are typically applied to multiple code words which are encoded across a number of memory cells. LDPC codes are desirable because they incur a relatively low overhead cost. However, this is an example implementation only, as any type of error correction code can be used.

An LDPC code is a linear block code which is characterized by a sparse parity check matrix, e.g., as depicted by the matrix H. The matrix includes K information bits and M parity bits, and the code length is N=K+M. Further, the parity bits are defined such that M parity check equations are satisfied, where each row of the matrix represents a parity check equation. In particular, the rows of the matrix are identified by check nodes cn1 through cn10 and the columns are identified by variables v1 through v13, which indicate the data that is stored in the storage elements, e.g., the code word bits. This data includes information bits i and parity bits p, based on the equation:

$$H \cdot \bar{v} = H \cdot \begin{bmatrix} i \\ p \end{bmatrix} = 0,$$

where H is the sparse parity check matrix, $\bar{v}$ is the data matrix, $\bar{i}$ is the information bit matrix and p is the parity bit matrix. The information bits can be taken from different bit positions of different code words, in one approach. The data matrix v can be determined by solving the above equation. Further, this can be done efficiently using a Gaussian elimination procedure if the matrix H is lower triangular.

FIG. 12B depicts a sparse bipartite graph which corresponds to the sparse parity check matrix of FIG. 12A. The graph indicates in further detail how the LDPC code works. The variable nodes v1 through v13 represent the code word bits and the check nodes cn1 through cn10 represent the parity check constraints on the bits.

During decoding, the decoder attempts to satisfy the parity checks. In this example, there are ten parity checks as indicated by the check nodes cn1 through cn10. The first parity check at cn1 determines if $v2 \otimes v4 \otimes v11 \otimes v13 = 0$, where $\otimes$ denotes the exclusive-or (XOR) logical operation. This check is satisfied if there is an even number of "1" bits in v2, v4, v11 and v13. This check is denoted by the fact that arrows from nodes v2, v4, v11 and v13 point to node cn1 in the graph 1300. The second parity check at cn2 determines if $v11 \otimes v7 \otimes v12 = 0$, which is satisfied if there is an odd number of "1" bits. The third parity check at cn3 determines if $v3 \otimes v5 \otimes v6 \otimes v9 \otimes v10=0$, which is satisfied if there is an odd number of "1" bits. Similarly, the fourth parity check at cn4 determines if $v2 \otimes v8 \otimes v11=0$, the fifth parity check at cn5 determines if $v4 \otimes v7 \otimes v12=0$, the sixth parity check at cn6 determines if $v1 \otimes v5 \otimes v6 \otimes v9=0$, the seventh parity check at cn7 determines if $v2 \otimes v8 \otimes v10 \otimes v13=0$, the eighth parity check at cn8 determines if $v4 \otimes v7 \otimes v11 \otimes v12=0$, the ninth parity check at cn9 determines if $v1 \otimes v3 \otimes v5 \otimes v13=0$ and the tenth parity check at cn01 determines if $v7 \otimes v8 \otimes v9 \otimes v10=0$.

The decoding process for LDPC is an iterative probabilistic decoding process known as iterative message passing decoding. The iterating involves serially traversing the check nodes and updating the LLR values of the bits involved based on each parity check. In one approach, an attempt is made to satisfy the first parity check of cn1. Once that parity check is satisfied, an attempt is made to satisfy the first parity check of cn2 and so forth. The LLR values are adjusted, if necessary, for each iteration.

Accordingly, it can be seen that, in one embodiment, an apparatus comprises: a memory cell arranged on a memory die; a sense circuit connected to the memory cell, the sense circuit comprising first and second latches storing first and second read data, respectively, of the memory cell; a set of output latches accessible to an off-die controller; and on-die circuitry configured to transfer the first and second read data from the first and second latches to the set of output latches.

In another embodiment, a method comprises: reading a set of memory cells relative to a baseline read threshold and, in response, storing read data relative to the baseline read threshold in a first set of latches; reading the set of memory cells relative to shifted read thresholds which are shifted relative to the baseline read threshold and, in response, storing read data relative to the shifted read thresholds in the first set of latches; transferring the read data relative to the baseline read threshold from the first set of latches to a second set of latches accessible to an off-die controller; and transferring the read data relative to the shifted read thresholds from the first set of latches to the second set of latches, the read data relative to the shifted read thresholds and the read data relative to the baseline read threshold are stored concurrently in the second set of latches.

In another embodiment, an apparatus comprises: a set of memory cells on a die, the set of memory cells storing data; means for obtaining hard bits of read data from the set of memory cells in response to an initial read command from an off-die controller; and means for obtaining soft bits of read data from the set of memory cells in response to the initial read command and in preparation for a first recovery read command from the off-die controller.

The means for obtaining hard bits and the means for obtaining soft bits may include the control circuitry 110, the column control circuitry of 104 and the row control circuitry 102 of FIG. 1A, the sense circuit 800a of FIG. 8C or other logic hardware, and/or other executable code stored on a computer readable storage medium or device. Other embodiments may include similar or equivalent means.

In another embodiment, an apparatus comprises: a set of memory cells on a die, the set of memory cells are connected to a word line; a set of sense circuits connected to the set of memory cells, the set of sense circuits configured to read a subset of the set of memory cells using multiple read thresholds, and store read data for each of the multiple read thresholds, the multiple read thresholds comprise a baseline read threshold and a first and second shifted read threshold; and on-die circuitry configured to transfer the read data from the set of sense circuits to a set of latches accessible to an off-die controller, the read data for the first and second shifted read thresholds are stored concurrently in the set of latches.

In another embodiment, a system comprises: a memory die comprising a set of memory cells, a set of latches, and circuitry connected to the set of memory cells and to the set of latches; and a controller connected to the memory die, the controller configured to issue a first read command to the circuitry, retrieve corresponding first read data from the set of latches, decode the first read data, and based on whether the decoding of the first read data results in an uncorrectable error, decide whether to issue a second read command to the circuitry for additional read data to assist in the decoding of the first read data, and the circuitry configured to, in response to the first read command, read the set of memory cells to obtain the first read data and the additional read data and, in response, to the second read command, output the additional read data to the controller.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a memory cell arranged on a memory die;
a sense circuit connected to the memory cell, the sense circuit comprising first and second latches storing first and second read data, respectively, of the memory cell, the sense circuit, to obtain the first read data, is configured to sense the memory cell relative to a baseline read threshold and, to obtain the second read data, is configured to sense the memory cell relative to a recovery read threshold which is shifted relative to the baseline read threshold;
a set of output latches accessible to an off-die controller, the sense circuit is configured to obtain the second read data while the off-die controller decodes the first read data; and
on-die circuitry configured to transfer the first and second read data from the first and second latches to the set of output latches.

2. The apparatus of claim 1, wherein:
the sensing of the memory cell relative to the recovery read threshold is in preparation for a recovery read command from the off-die controller.

3. The apparatus of claim 2, wherein:
the first and second read data are stored concurrently in the set of output latches.

4. The apparatus of claim 1, wherein:
the sense circuit comprises first and second comparators configured to obtain the first and second read data.

5. The apparatus of claim 1, wherein:
the on-die circuitry is configured to discard the first and second read data from the set of output latches when the recovery read command is not received from the off-die controller.

6. The apparatus of claim 1, wherein:
the memory cell is in a set of memory cells which is read in response to a read command from the off-die controller,
the set of memory cells comprises no more than half of a number of memory cells connected to a word line; and
a number of latches in the set of output latches is at least equal to the number of memory cells.

7. The apparatus of claim 6, wherein:
the read command identifies first and second portions of the set of output latches to store the first and second read data, respectively.

8. A method, comprising:
in response to a first read command from an off-die controller for read data relative to a baseline read threshold:
reading a set of memory cells relative to the baseline read threshold and, in response, storing read data relative to the baseline read threshold in a first set of latches;
reading the set of memory cells relative to shifted read thresholds which are shifted relative to the baseline read threshold and, in response, storing read data relative to the shifted read thresholds in the first set of latches;
transferring the read data relative to the baseline read threshold from the first set of latches to a second set of latches accessible to an off-die controller;
transferring the read data relative to the shifted read thresholds from the first set of latches to the second set of latches; and
informing the off-die controller that the read data relative to the baseline read threshold is available for retrieval from the second set of latches, the read data relative to the shifted read thresholds and the read data relative to the baseline read threshold are stored in the second set of latches.

9. The method of claim 8, wherein:
the read data relative to the shifted read thresholds and the read data relative to the baseline read threshold are stored concurrently in the second set of latches.

10. The method of claim 8, wherein:
the read data relative to the shifted read thresholds comprises recovery read data.

11. The method of claim 8, further comprising:
in response to a second read command from the off-die controller for the read data relative to the shifted read thresholds, informing the off-die controller that the read data relative to the shifted read thresholds is available for retrieval from the second set of latches.

12. An apparatus, comprising:
a set of memory cells on a die, the set of memory cells storing data;
means for obtaining hard bits of read data from the set of memory cells in response to an initial read command from an off-die controller; and
means for obtaining soft bits of read data from the set of memory cells in response to the initial read command, in preparation for a first recovery read command from the off-die controller and while the off-die controller decodes the hard bits of read data.

13. The apparatus of claim 12, further comprising:
means for obtaining additional soft bits of read data from the set of memory cells in response to a second recovery read command from the off-die controller.

14. An apparatus, comprising:
a controller configured to connect to a memory die, the memory die comprising a set of memory cells, a set of latches, and circuitry, the controller is configured to issue a first read command to the circuitry to obtain first read data from a first subset of the set of memory cells, the circuitry is configured to, in response to the first read command, read the first subset of the set of memory cells to obtain the first read data, transfer the first read data to a first portion of the set of latches identified by a respective address, read the first subset of the set of memory cells to obtain additional read data before the additional read data is requested by the controller and to transfer the additional read data to a second portion of the set of latches identified by a later address than the address at which the first read data is stored; and
the controller is also configured to retrieve the first read data from the first portion of the set of latches, decode the first read data, and when the decoding of the first read data results in an uncorrectable error, issue a second read command to the circuitry to obtain the additional read data to assist in the decoding of the first read data, and retrieve the additional read data from the second portion of the set of latches.

15. The apparatus of claim 14, wherein:
the first read data comprise baseline read data; and
the additional read data comprise recovery read data.

16. An apparatus, comprising:
a set of memory cells on a die, the set of memory cells are connected to a word line and are arranged in a first subset and a second subset;
a set of sense circuits connected to the set of memory cells, one sense circuit per memory cell;
a set of sense circuit controllers, each sense circuit controller is associated with a plurality of sense circuits of the set of sense circuits, the set of sense circuit controllers are arranged in a plurality of groups comprising first groups of sense circuit controllers associated with sense circuits of the first subset of the set of memory cells and second groups of sense circuit controllers associated with sense circuits of the second subset of the set of memory cells;
a set of latches connected to the set of sense circuit controllers, the set of latches is sized to store one bit from each memory cell connected to the word line and comprises one latch per sense circuit, the set of latches are arranged in a plurality of groups comprising first groups of latches and second groups of latches, wherein a number of groups of the plurality of groups of the sets of latches is equal to a number of groups of the plurality of groups of the sense circuit controllers; and
circuitry connected to the set of sense circuit controllers and the set of latches, the circuitry is configured to receive a read command which is limited to the first subset of the set of memory cells; wherein:
in response to the read command, the first groups of sense circuit controllers are configured to:
transfer first bits of read data from the first subset of the set of memory cells to the first groups of latches; and
transfer second bits of read data from the first subset of the set of memory cells to the second groups of latches, wherein:
the first bits of read data comprise baseline read data;
the second bits of read data comprise recovery read data;
portions of the set of latches are identified by addresses; and the recovery read data is stored at a later address than an address at which the baseline read data is stored.

17. The apparatus of claim 16, wherein:
the first bits of read data are stored in the first groups of latches concurrent with the second bits of read data being stored in the second group of latches for retrieval by an off-die controller.

* * * * *